(12) United States Patent
Riess et al.

(10) Patent No.: US 8,860,225 B2
(45) Date of Patent: Oct. 14, 2014

(54) DEVICES FORMED WITH DUAL DAMASCENE PROCESS

(75) Inventors: Philipp Riess, Munich (DE); Erdem Kaltalioglu, Newburgh, NY (US); Hermann Wendt, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 226 days.

(21) Appl. No.: 13/271,878

(22) Filed: Oct. 12, 2011

(65) Prior Publication Data

US 2012/0025382 A1 Feb. 2, 2012

Related U.S. Application Data

(62) Division of application No. 12/051,644, filed on Mar. 19, 2008, now Pat. No. 8,062,971.

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/522* | (2006.01) | |
| *H01L 21/768* | (2006.01) | |
| *H01L 21/316* | (2006.01) | |
| *H01L 23/532* | (2006.01) | |

(52) U.S. Cl.
CPC ....... *H01L 23/5226* (2013.01); *H01L 21/31629* (2013.01); *H01L 21/31608* (2013.01); *H01L 23/53228* (2013.01); *H01L 23/53295* (2013.01); *H01L 23/5329* (2013.01); *H01L 21/31695* (2013.01); *H01L 21/76816* (2013.01); *H01L 21/76808* (2013.01)

USPC ............. 257/774; 257/E23.151; 257/E23.152

(58) Field of Classification Search
CPC .............. H01L 23/5226; H01L 23/528; H01L 21/76816
USPC .................................... 257/774, E23.151–152
See application file for complete search history.

(56) References Cited

U.S. PATENT DOCUMENTS

| | | | |
|---|---|---|---|
| 6,020,255 A | 2/2000 | Tsai et al. | |
| 6,103,617 A * | 8/2000 | Yoon et al. | 438/624 |
| 6,197,685 B1 * | 3/2001 | Domae et al. | 438/648 |
| 6,297,149 B1 | 10/2001 | Stamper | |
| 6,300,235 B1 | 10/2001 | Feldner et al. | |
| 6,461,955 B1 | 10/2002 | Tsu et al. | |
| 6,559,048 B1 * | 5/2003 | Kim et al. | 438/637 |
| 6,627,557 B2 | 9/2003 | Seta et al. | |
| 6,779,167 B2 * | 8/2004 | Igarashi et al. | 257/774 |
| 7,071,097 B2 * | 7/2006 | Colburn | 438/637 |
| 7,075,182 B2 * | 7/2006 | Mitani et al. | 257/758 |
| 7,081,406 B2 * | 7/2006 | Lo et al. | 438/620 |
| 7,102,235 B2 * | 9/2006 | Raaijmakers et al. | 257/758 |
| 7,151,051 B2 * | 12/2006 | He et al. | 438/622 |
| 7,192,868 B2 | 3/2007 | Cotte et al. | |
| 7,268,434 B2 * | 9/2007 | Nakashima | 257/774 |
| 7,301,236 B2 * | 11/2007 | Greco et al. | 257/758 |
| 7,323,357 B2 | 1/2008 | Seidl | |
| 7,651,942 B2 * | 1/2010 | Huebinger et al. | 438/639 |

(Continued)

*Primary Examiner* — Jarrett Stark
(74) *Attorney, Agent, or Firm* — Slater & Matsil, L.L.P.

(57) ABSTRACT

Structures and methods of forming metallization layers on a semiconductor component are disclosed. The method includes etching a metal line trench using a metal line mask, and etching a via trench using a via mask after etching the metal line trench. The via trench is etched only in regions common to both the metal line mask and the via mask.

30 Claims, 21 Drawing Sheets

(56) References Cited

U.S. PATENT DOCUMENTS

| | | | |
|---|---|---|---|
| 7,786,017 B1* | 8/2010 | Morgenfeld et al. | 438/712 |
| 7,906,436 B2* | 3/2011 | Konishi | 438/736 |
| 7,960,797 B2* | 6/2011 | Lee et al. | 257/382 |
| 2003/0045093 A1* | 3/2003 | Givens et al. | 438/644 |
| 2004/0217087 A1 | 11/2004 | Celii et al. | |
| 2006/0024945 A1 | 2/2006 | Kim et al. | |
| 2006/0077702 A1 | 4/2006 | Sugimae et al. | |
| 2006/0180930 A1* | 8/2006 | Nguyen et al. | 257/758 |
| 2006/0216926 A1 | 9/2006 | Ye et al. | |
| 2006/0244146 A1* | 11/2006 | Colburn | 257/758 |
| 2006/0246718 A1* | 11/2006 | Frohberg et al. | 438/638 |
| 2007/0020928 A1* | 1/2007 | Albertson et al. | 438/672 |
| 2007/0037385 A1* | 2/2007 | Huebinger et al. | 438/638 |
| 2007/0076509 A1* | 4/2007 | Zhang | 365/230.03 |
| 2007/0210453 A1* | 9/2007 | Large et al. | 257/758 |
| 2007/0278681 A1* | 12/2007 | Yu et al. | 257/758 |
| 2008/0026567 A1* | 1/2008 | Greco et al. | 438/637 |
| 2009/0200683 A1 | 8/2009 | Colburn et al. | |
| 2010/0308469 A1* | 12/2010 | Tsai et al. | 257/774 |
| 2013/0099390 A1* | 4/2013 | Kurita et al. | 257/774 |

* cited by examiner

DEVICES FORMED WITH DUAL DAMASCENE PROCESS

This is a divisional application of U.S. application Ser. No. 12/051,644, entitled "Dual Damascene Process," which was filed on Mar. 19, 2008, and is hereby incorporated herein by reference.

TECHNICAL FIELD

This invention relates generally to electronic devices, and more particularly to dual damascene processes.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of semiconductor devices. The manufacturing of semiconductor devices is typically classified into two phases, the front end of line (FEOL) and the back end of line (BEOL). The BEOL is typically considered to be the point of the manufacturing process where metallization layers are formed, and the FEOL is considered to include the manufacturing processes prior to the formation of metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). The conductive lines in adjacent horizontal metallization layers may be connected vertically in predetermined places by vias formed between the conductive lines.

One of the challenges in semiconductor technology requires developing technologies that minimize process variations. Hence, a given technology is optimized in view of the process limitations. For example, metal lines are normally patterned wider near and above vias to minimize misalignment errors. However, such adjustments in the process are usually at some other expense. For example, wider metal lines result in a reduction in spacing between the metal lines, and can result in unwanted effects such as yield or performance loss.

Thus, what are needed in the art are cost effective ways of forming BEOL metallization without significant increase in costs or yield, performance and reliability loss.

SUMMARY OF THE INVENTION

These and other problems are generally solved or circumvented, and technical advantages are generally achieved, by embodiments of the present invention.

Embodiments of the invention include methods for forming metal and vias using a self aligned dual damascene process. In accordance with an embodiment of the present invention, the method includes etching a metal line trench using a metal line mask, and etching a via trench using a via mask after etching the metal line trench. The via trench is etched only in regions common to both the metal line mask and the via mask.

The foregoing has outlined rather broadly an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1e, illustrates self aligned vias and metal lines fabricated in accordance with embodiments of the invention, wherein FIG. 1a illustrates a cross sectional view, FIG. 1b illustrates a top view of the vias and the metal lines, FIG. 1c illustrates a magnified top view of the vias and the metal lines, FIG. 1d illustrates a cross sectional view, and FIG. 1e illustrates a cross sectional side view, in accordance with embodiments of the invention;

FIG. 2, which includes FIGS. 2a-2v, illustrates a method of fabrication a metal level and a via level in various stages of fabrication, in accordance with embodiments of the invention, wherein FIGS. 2a, 2c, 2e, 2g, 2i, 2k, 2m, 2o, 2q, 2s, and 2u illustrate cross section views of the interconnect structure and FIGS. 2b, 2d, 2f, 2h, 2j, 2l, 2n, 2p, 2r, 2t, and 2v illustrate top views of a metallization layer, in accordance with embodiments of the invention;

FIG. 4, which includes

FIG. 6, which includes

FIG. 7, which includes FIG. 8 illustrates a top view of a metal level, wherein FIG. 8a illustrates the top view of a metal level fabricated using embodiments of the invention, and wherein

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure and method for forming interconnect metallization using damascene processes.

In conventional dual damascene processes, the via trench is first etched, followed by an etch to form trenches that form metal lines. Consequently, a key constraint in this process is the ability to overlay the metal line trench etch with the via trench etch. However, this is a challenging task and involves minimizing any wafer, as well as, mask alignment errors. Hence, in practice, this misalignment between the metal line trenches and via trenches is minimized by etching the metal lines wider than the vias, particularly on top of the vias. However, this wider metal line over the vias results in other problems. For example, the increased metal width reduces the spacing between neighboring or adjacent metal lines. Particularly, if this spacing decreases to a distance less than the design rule spacing, significant deleterious impacts may be observed. For example, the reduced spacing between metal lines may decrease the process margin during manufacturing and result in lower process yield. The increased metal width can also reduce performance (increased interconnect coupling) as well as increased reliability problems during product testing (e.g., dielectric breakdown such as TDDB) and operation.

In various embodiments, the invention avoids the problems arising from misalignment between metal lines and vias. In various embodiments, the present invention overcomes these limitations by forming the trench for via after forming the trench for metal lines. The trench for via is etched only in regions with a metal line trench overlying it. Further, in various embodiments, the invention achieves this by the use of a sacrificial material layer that is resistant to the via etch and protects other regions of the structures from being etched.

A structural embodiment of the invention will be first described using FIG. 1. Embodiments of the methods of fabrication will be described using FIGS. 2 and 4 and the flow charts of FIGS. 3 and 5. An application for minimizing misalignment in metal and via levels in accordance with an embodiment of the invention is discussed using FIG. 6. An embodiment of the invention illustrating a via mask used in the fabrication of the vias and metal lines is illustrated in FIG. 7. FIG. 8 compares the metallization fabricated using embodiments of the present invention to metallization fabricated using conventional processing.

Figure 1A:
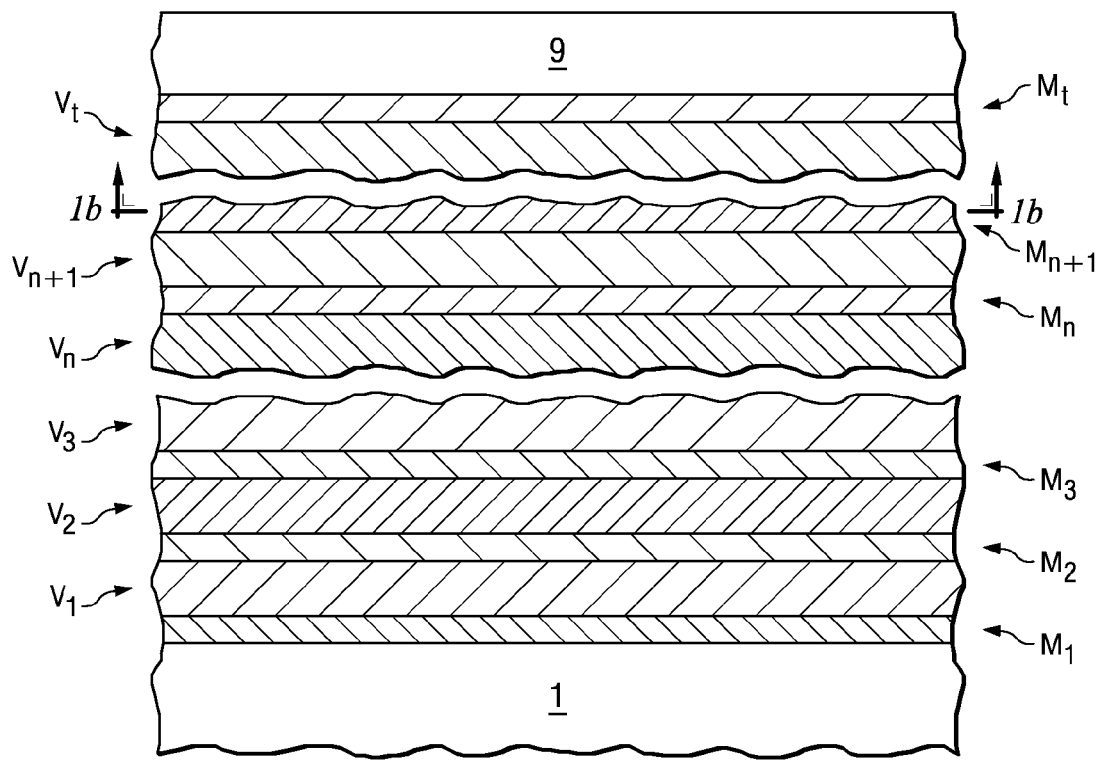

An embodiment of the invention is illustrated in FIG. 1 which includes FIGS. 1a-1e. FIG. 1a illustrates a cross sectional of a semiconductor chip comprising multiple layers of metal and via levels disposed over a substrate 1. The substrate 1 comprises the active devices forming the active circuitry of the semiconductor chip. The active circuitry contains the active device regions and includes necessary transistors, resistors, capacitors, inductors or other components used to form integrated circuits. For example, active areas that include transistors (e.g., CMOS transistors) can be separated from one another by isolation regions (e.g., shallow trench isolation).

Next, metallization is formed over the active device regions to electrically contact and interconnect the active devices. The metallization and active device regions together form a complete functional integrated circuit. In other words, the electrical functions of the chip can be performed by the interconnected active circuitry.

FIG. 1a illustrates the metallization formed with metal levels $M_1$ to $M_r$ and corresponding via levels $V_1$ to $V_r$. The metal levels connect the various active devices on the chip, whereas, the via levels connect the different metal levels. In logic devices, the metallization may include many layers, e.g., nine or more, of copper or alternatively of other metals. In memory devices, such as DRAMs, the number of metal levels may be less and may be aluminum. The interconnect structure is typically covered with additional passivation layer 9 and suitable structure forming connections for packaging.

Figure 1B:
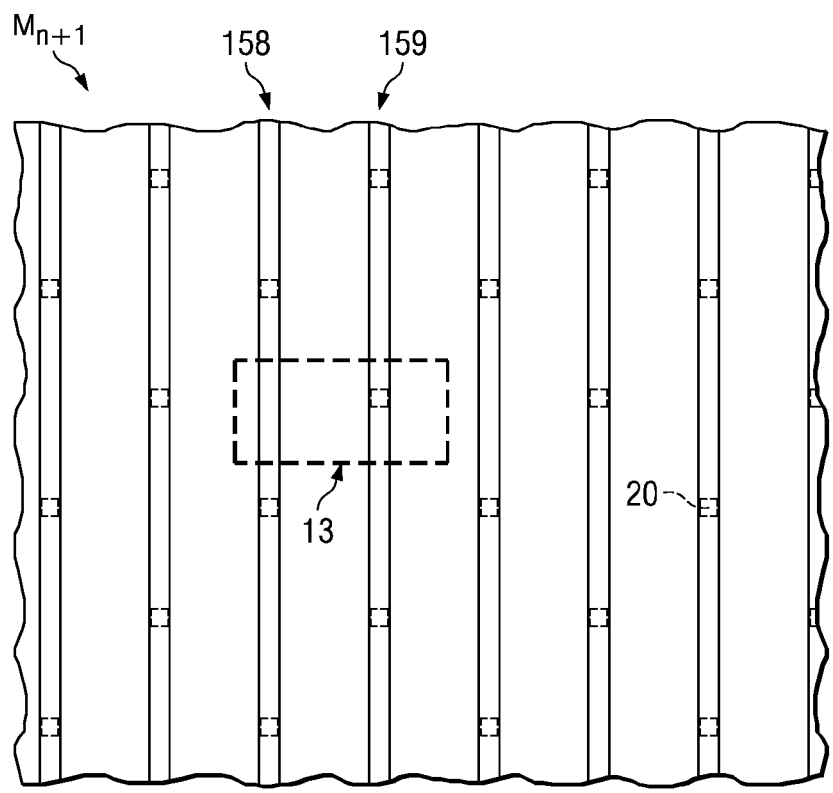
Figure 1C:
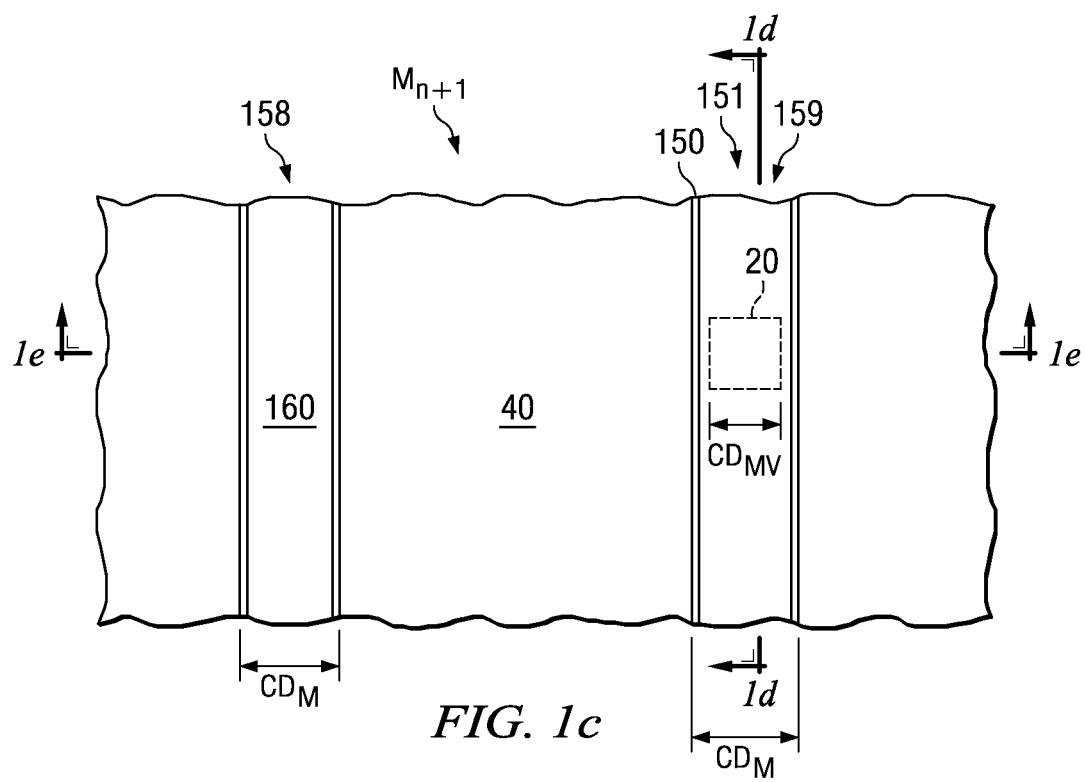

A top view cross section of a metal level $M_{n+1}$ is illustrated in FIG. 1b and FIG. 1c. FIG. 1c illustrates a magnified view of the metal lines of the region 13 in FIG. 1b. Each metal level comprises metal lines embedded in an inter-level dielectric layer. For example, the metal level $M_{n+1}$ comprises a second and third metal lines 158 and 159 embedded in a second inter-level dielectric layer 40. The second and third metal lines 158 and 159 comprise a metal 160. A first metal line 20 is disposed underneath the second inter-level dielectric layer 40 in a lower metal level $M_n$.

As illustrated in FIGS. 1b and 1c, the metal lines (for example, second and third metal lines 158 and 159) comprise a top critical dimension (width) that is constant across the metal level. Even in regions overlying vias (in FIGS. 1b and 1c vias overlie the first metal line 20 as they connect with the first metal line 20), the top critical dimension (width) of the metal line ($CD_{MV}$) is about the same as the top critical dimension (width) of the metal line in regions without any vias underneath ($CD_M$).

Figure 1D:
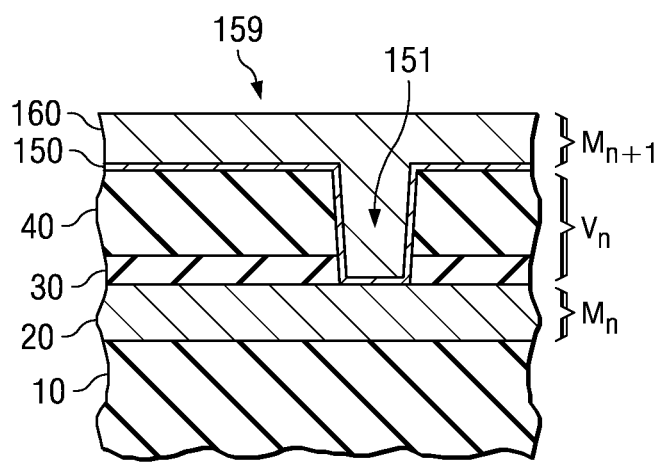
Figure 1E:
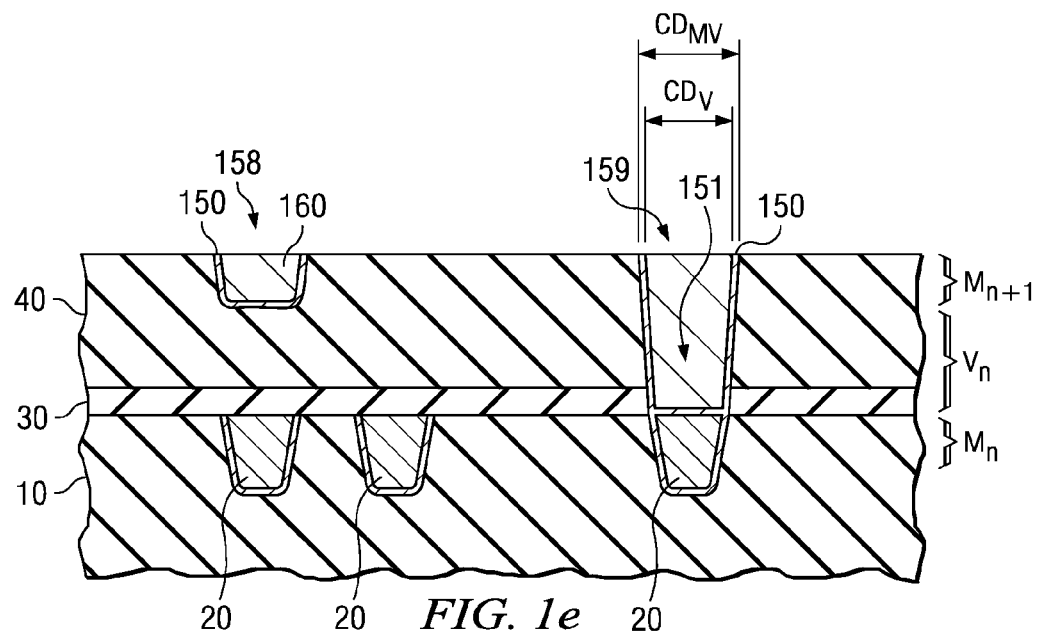

Vertical cross sectional views of the interconnect structure of FIG. 1c is illustrated in FIGS. 1d and 1e. FIGS. 1d and 1e illustrate a magnified cross section of the interconnect structure above the substrate 1, and hence illustrate a metal level $M_n$ disposed underneath the metal level $M_{n+1}$. The metal levels $M_n$ and $M_{n+1}$ are connected by an intermediate via level $V_n$. The vertical cross sectional views of FIGS. 1d and 1e illustrate the second and third metal lines 158 and 159 comprising the metal 160. The first metal line 20 is disposed in a first inter-level dielectric layer 10. The third metal line 159 is connected to the first metal line 20 through a via 151. The via 151 also comprises the metal 160. An etch stop layer 30 is disposed between the first and second inter-level dielectric layer 10 and 40.

Referring to FIG. 1e, the critical dimension of the vias (e.g., the top via CD) $CD_V$ is about the same as the top critical dimension (width) of the metal line over the vias ($CD_{MV}$ A method of fabrication of the structure will now be described using FIG. 2 and the flow chart of FIG. 3, in accordance with an embodiment of the invention. FIGS. 2 and 3 illustrate the formation of a metal level ($M_{n+1}$) and a via level ($V_n$) using a dual damascene process, in an embodiment of the invention. FIGS. 2a, 2c, 2e, 2g, 2i, 2k, 2m, 2o, 2q, 2s, and 2u illustrate cross section views of the interconnect structure and FIGS. 2b, 2d, 2f, 2h, 2j, 2l, 2n, 2p, 2r, 2t, and 2v illustrate top views of the interconnect structure during the fabrication process.

Figure 2A:
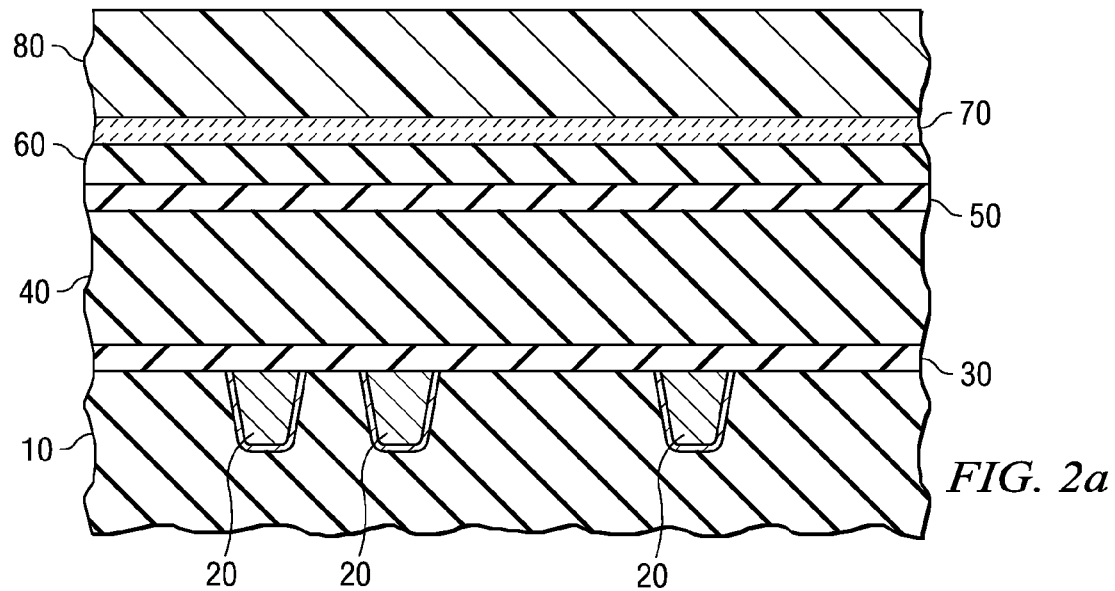
Figure 2B:
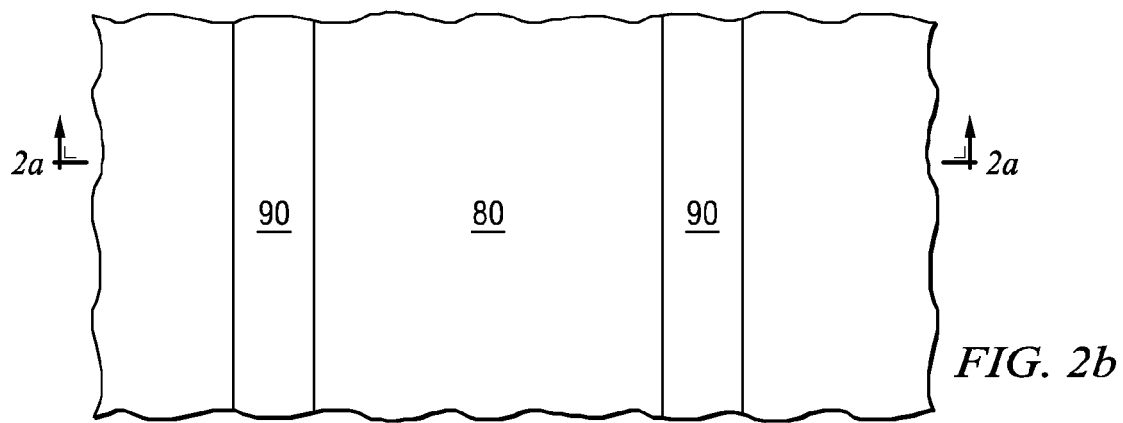
Figure 3:
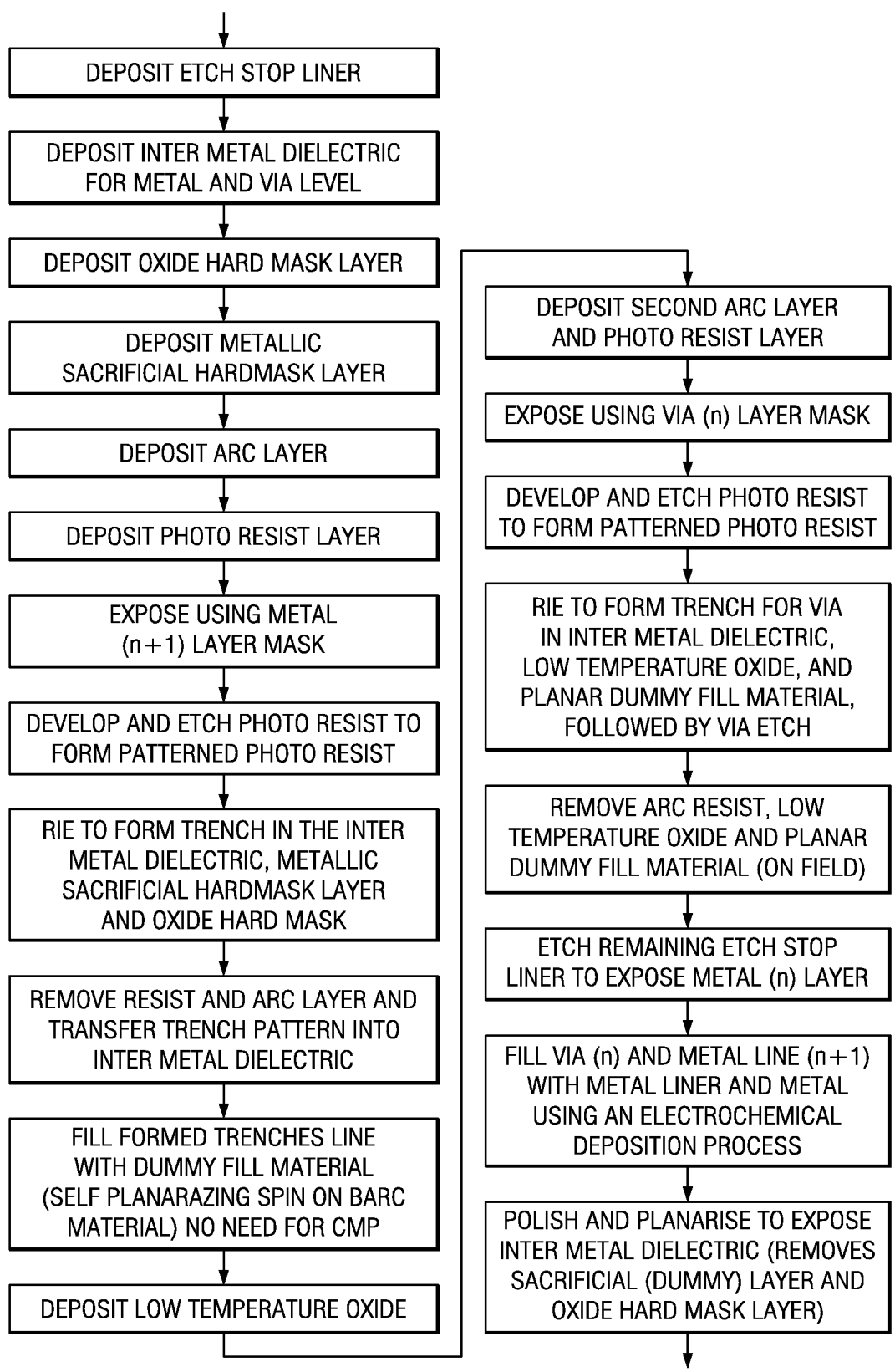
FIG. 3 illustrates a flow chart for formation of a metal and a via level illustrated in FIG. 2, in accordance with embodiments of the invention.

Referring first to FIGS. 2a and 2b, after formation of the first metal line 20 and the first inter-level dielectric 10, an etch stop liner 30 is deposited. The etch stop liner 30 is preferably a material comprising SiCHN such as nBLOK™ although, in other embodiments, other nitrides or other suitable materials may be used. Examples of etch stop liner 30 include materials such as silicon nitride (SiN), silicon oxynitride (SiON), silicon carbide (SiC) or silicon carbonitride (SiCN).

A second inter-level dielectric layer 40 is deposited over the etch stop liner 30. In various embodiments, the second inter-level dielectric layer 40 comprises insulating materials typically used in semiconductor manufacturing for inter-level dielectric (ILD) layers. The second inter-level dielectric layer 40 preferably comprises a low-k dielectric material such as a material selected from the group comprising silicon dioxide ($SiO_2$), fluorinated silicate glass (FSG), carbon doped glass (such as Black Diamond™, Coral™, Aurora™), organo silicate glass (OSG), hydrogen doped glass, porous carbon doped glass, porous silicon dioxide, polymeric dielectrics (e.g., FLARE™, SILK™), F-doped amorphous carbon, silicone based polymeric dielectrics such as hydrogen silsesquioxane (HSQ) and methylsilsesquioxane (MSQ). In some embodiments, the second inter-level dielectric layer 40 comprises ultra low-k materials such as porous silicate glass, xerogel, aerogel, nano clustered silica (NCS), porous organo silicate glass, porous organics. The second inter-level dielectric layer 40 may either be spin-on material or deposited by techniques such as CVD. Although alternatively, the second inter-level dielectric layer 40 may comprise other materials.

A first hard mask layer 50 is deposited over the second inter-level dielectric layer 40. The first hard mask layer 50 comprises $SiO_2$ such as tetra ethyl oxysilane (TEOS), silicon carbide (SiC) or carbon doped glass, but in various embodiments other materials may be used. A sacrificial material layer 60 is deposited over the first hard mask layer 50. The sacrificial material layer 60 preferably TiN or TaN. In some embodiments, the sacrificial material layer 60 comprises a metal (e.g., Ru, Hf, Ti, Ta, Ti, La, V, Nb, Pr, Dy, Sr, Gd, Mo); metal alloys (e.g., TiW); or nitrides (e.g., TiN, TaN, HfN, TaSiN, TiWN, NbN, MoN, TiAlN, MoSiN, HfSiN, TiSiN, or combinations of these); carbo-nitrides (e.g., TiCN, NbCN, HfCN, TaCN); silicides (e.g., $TiSi_2$, $WSi_2$).

Figure 2C:
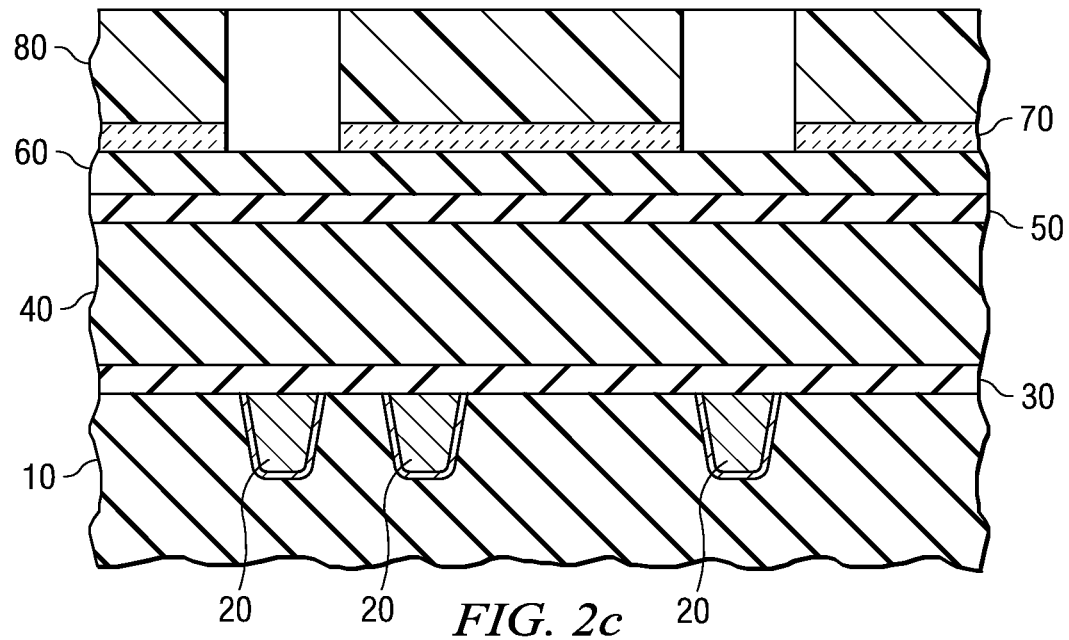
Figure 2D:
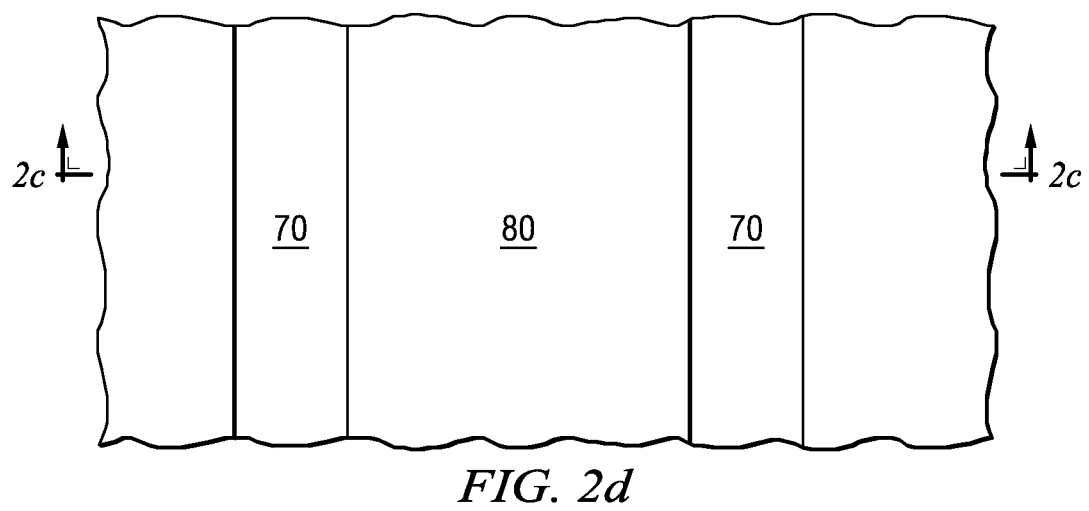

A first ARC layer 70 is deposited over the sacrificial material layer 60. A first photo resist 80 is deposited over the first anti reflective coating (ARC) layer 70. A metal line mask 90 (shown in FIG. 2b) is used to expose the first photo resist 80. The photo resist is next developed, for example, by a low temperature bake. As illustrated in FIGS. 2c and 2d, the exposed first photo resist 80 is etched to expose the first anti reflective coating (ARC) layer 70.

Figure 2E:
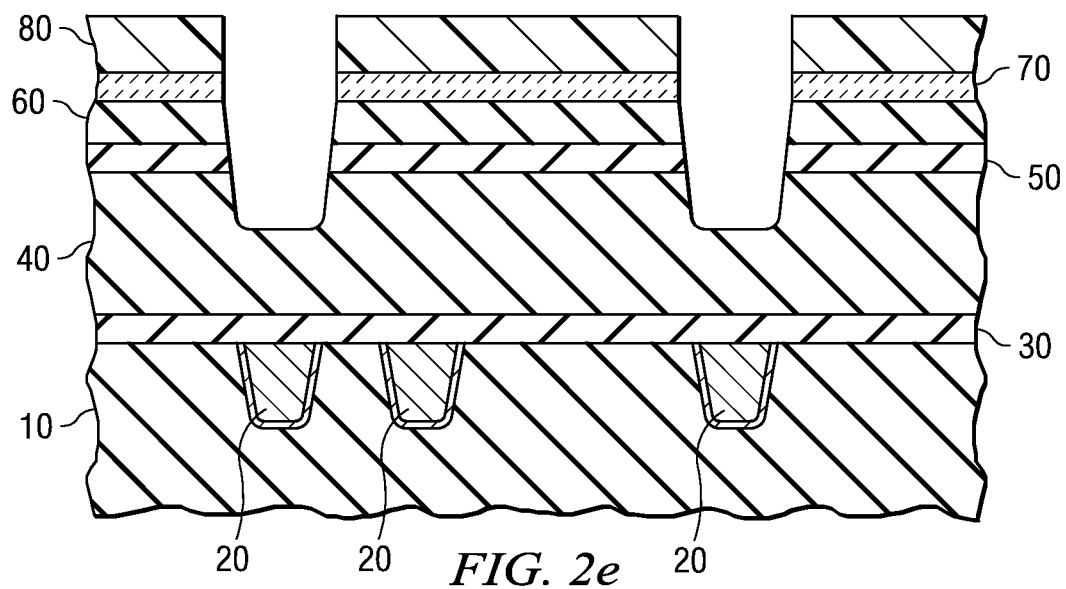
Figure 2F:
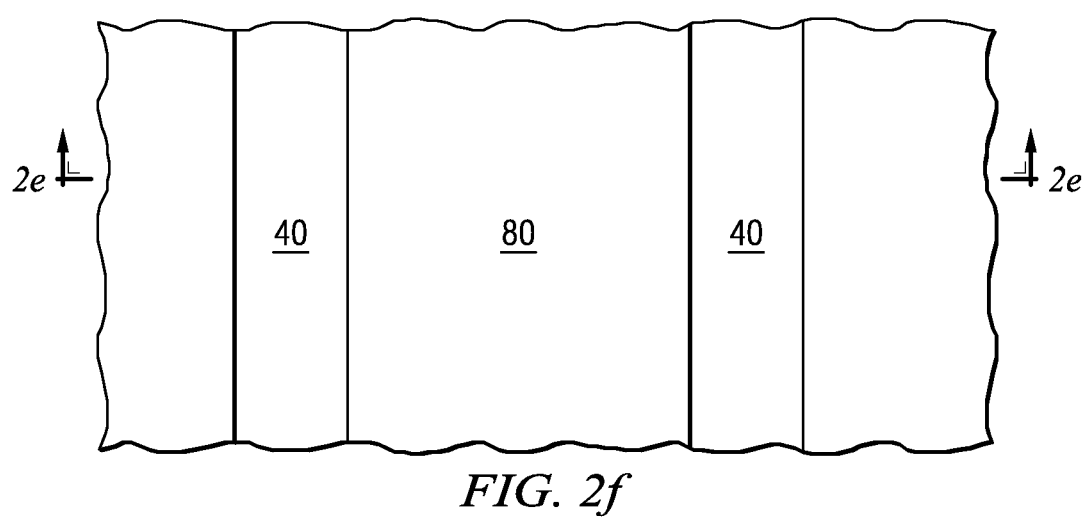

Referring next to FIGS. 2e and 2f, an anisotropic RIE process etches the first ARC layer 70, the sacrificial material layer 60, the first hard mask layer 50, and the second inter-level dielectric layer 40. As next illustrated in FIGS. 2g and 2h, the first photo resist 80 and the first ARC layer 70 are stripped off to form the trenches 75. The trenches 75 form the openings for forming metal lines. Some or all of the first photo resist 80 may be etched during the formation of the trenches 75.

A dummy fill material 105 is next used to fill the trenches 75 and forms the dummy filled trenches 100. The dummy fill material 105 comprises preferably a planarizing spin on material such as NFC™ manufactured by JSR, or other bottom anti-reflective coating materials (BARC). The dummy fill material 105 is overfilled to form a smooth surface. A second hard mask layer 110 is deposited over the dummy fill material 105, followed by a deposition of a second anti reflective coating (ARC) layer 120. The second hard mask layer 110 preferably comprises a low temperature oxide layer. A second photo resist 130 is deposited over the second ARC layer 120. FIG. 2j also illustrates the underlying dummy filled trenches 100.

Figure 2G:
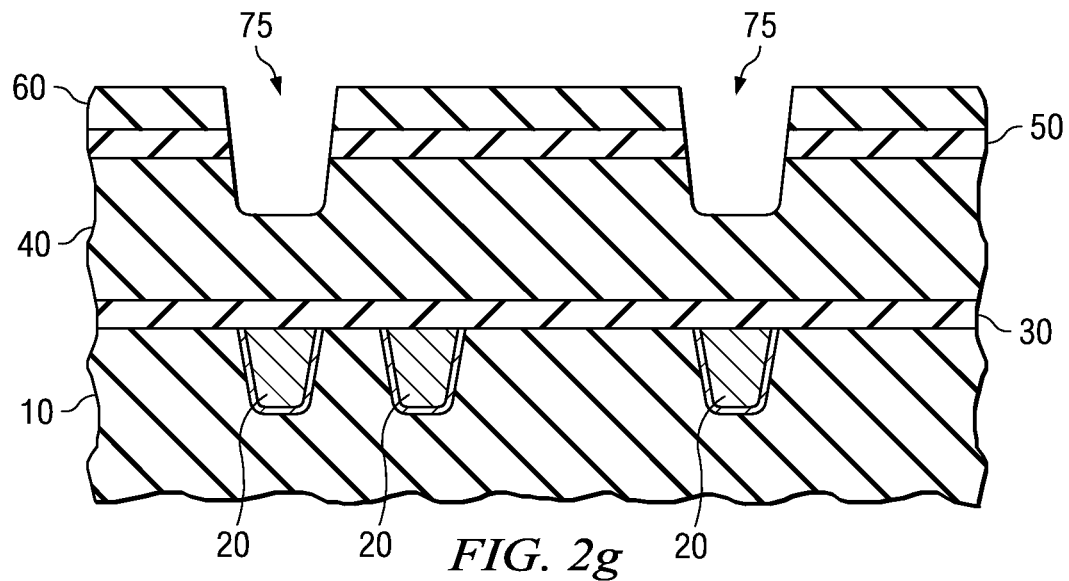
Figure 2H:
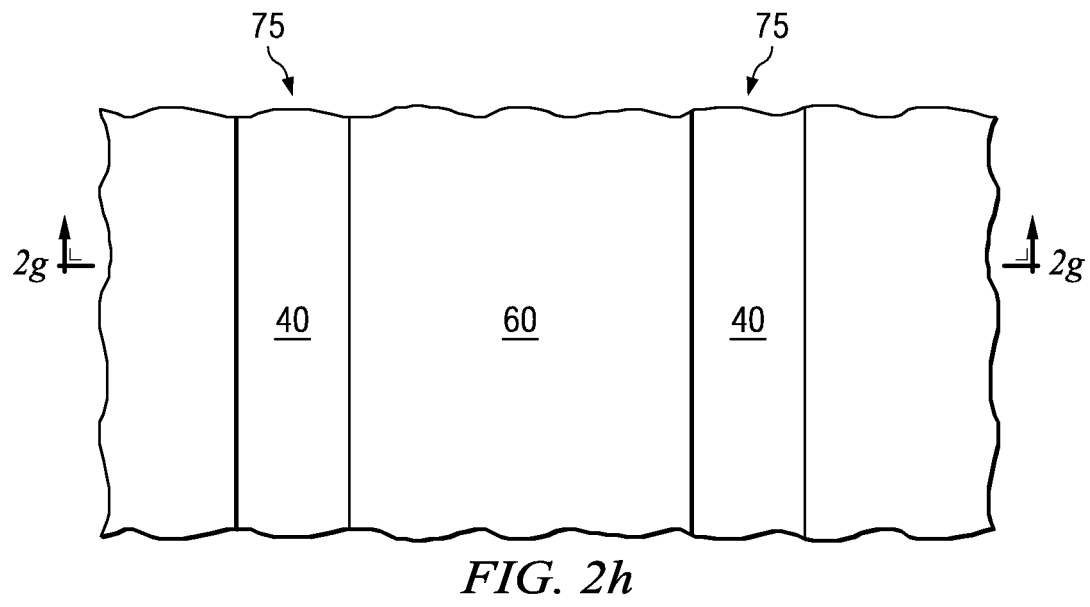
Figure 2I:
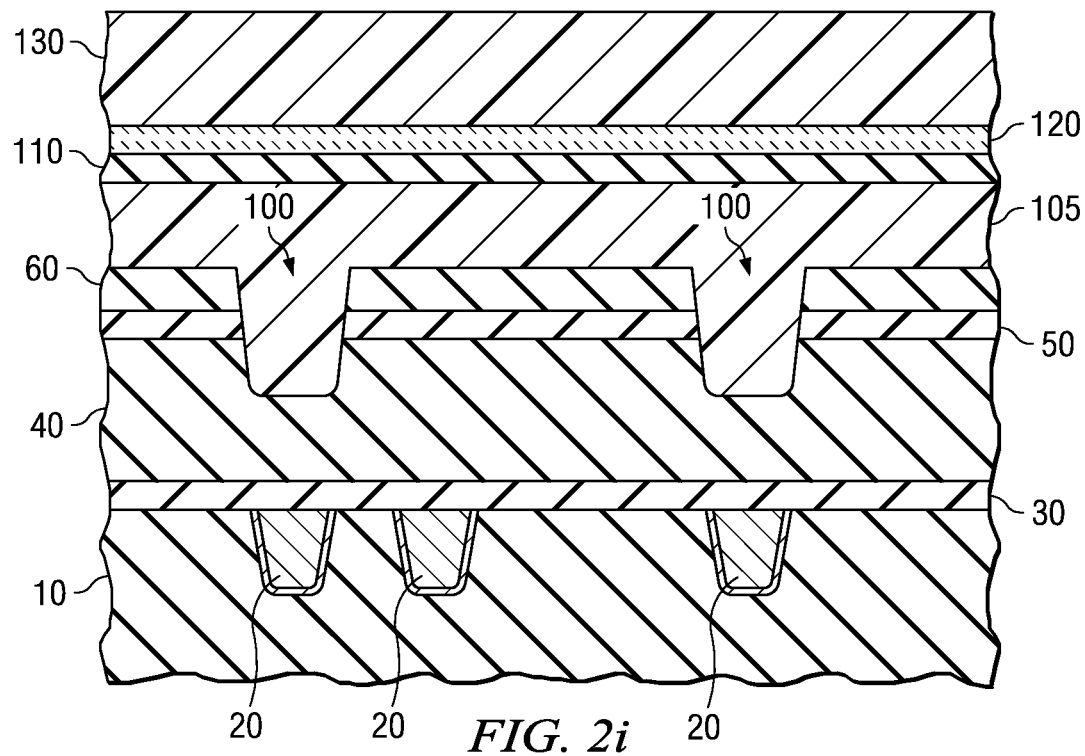
Figure 2J:
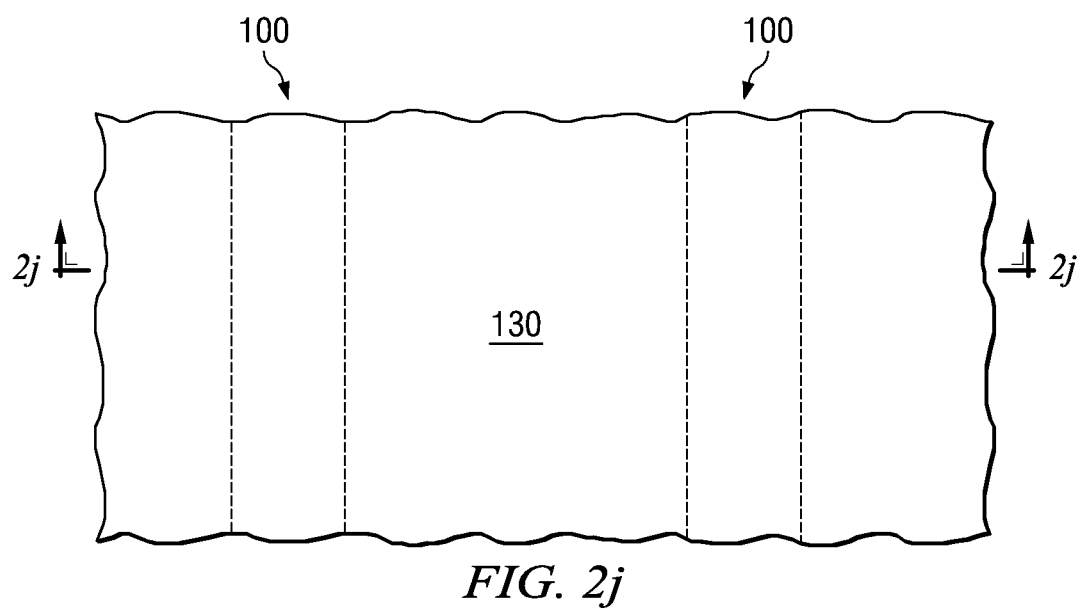
Figure 2K:
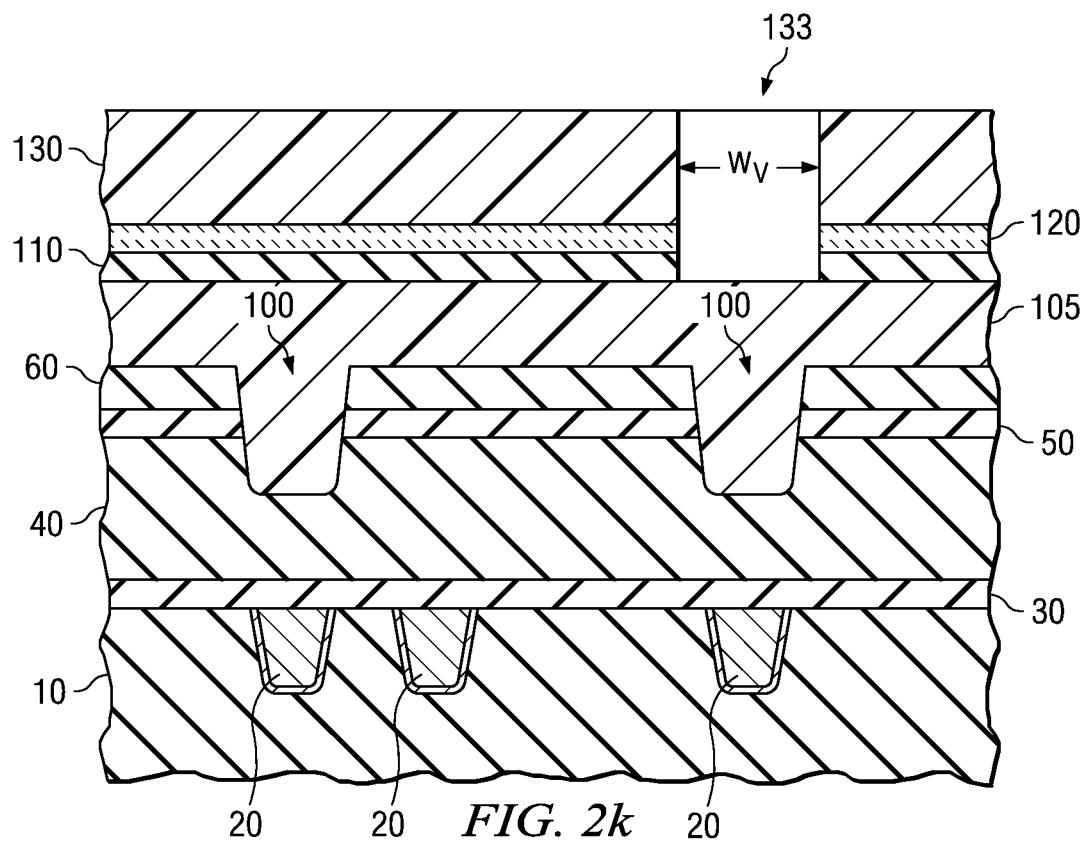
Figure 2L:
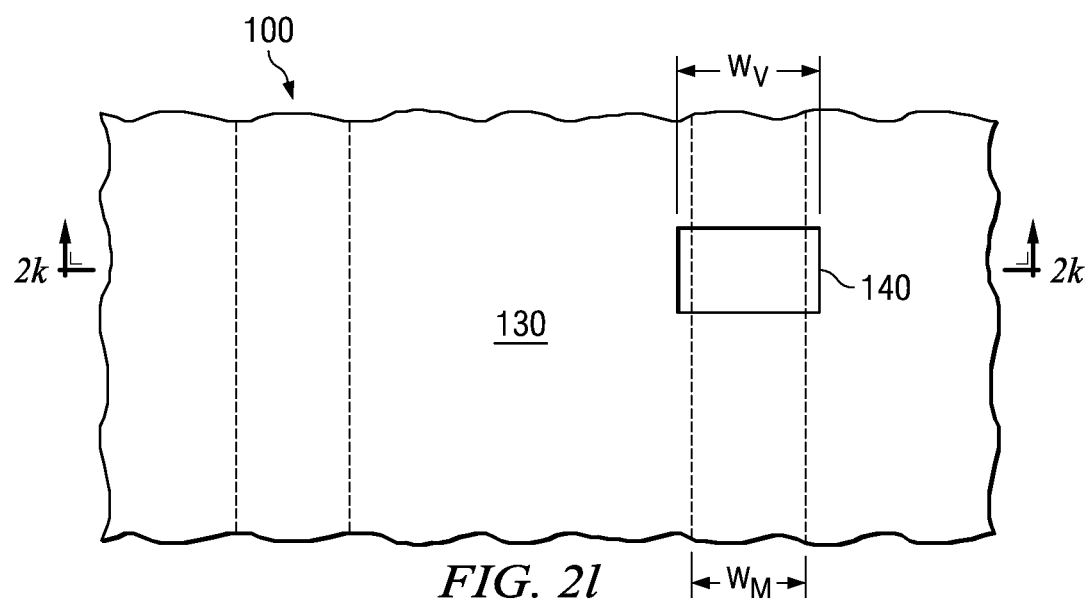

Referring next to FIGS. 2k and 2l, a via mask 140 is used to pattern the second photo resist 130. The via mask is preferably wider than the underlying dummy filled trenches 100, to minimize misalignment. For example, the width of the photo resist pattern 133 $W_V$ is greater than the top width of the trench $W_M$. However, in some embodiments this is not necessary.

Figure 2M:
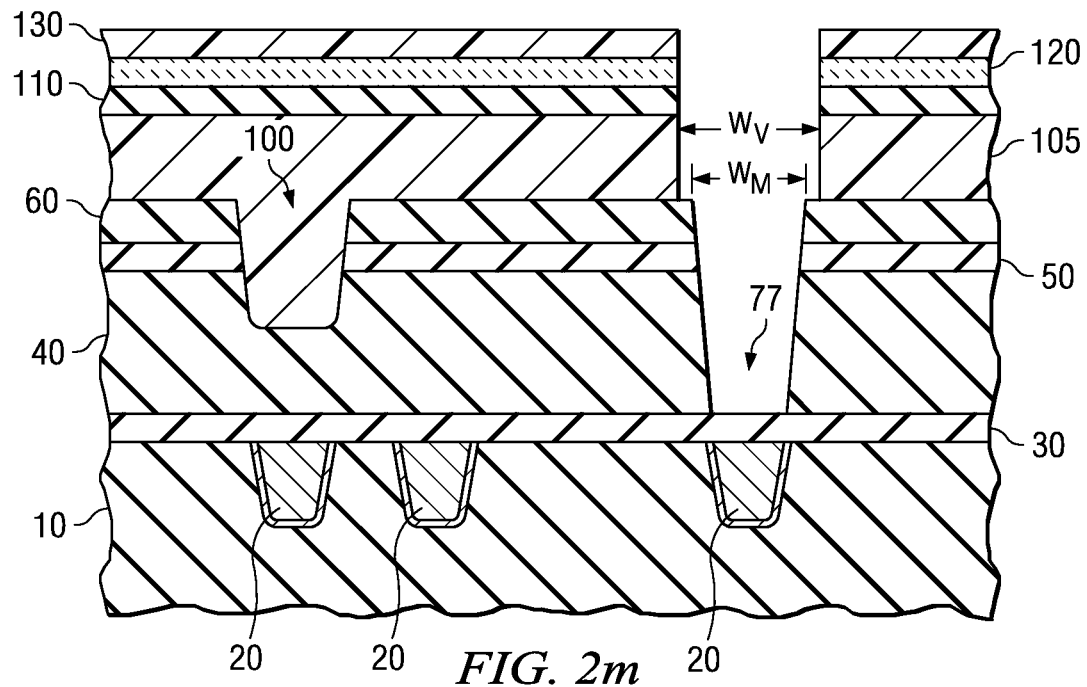
Figure 2N:
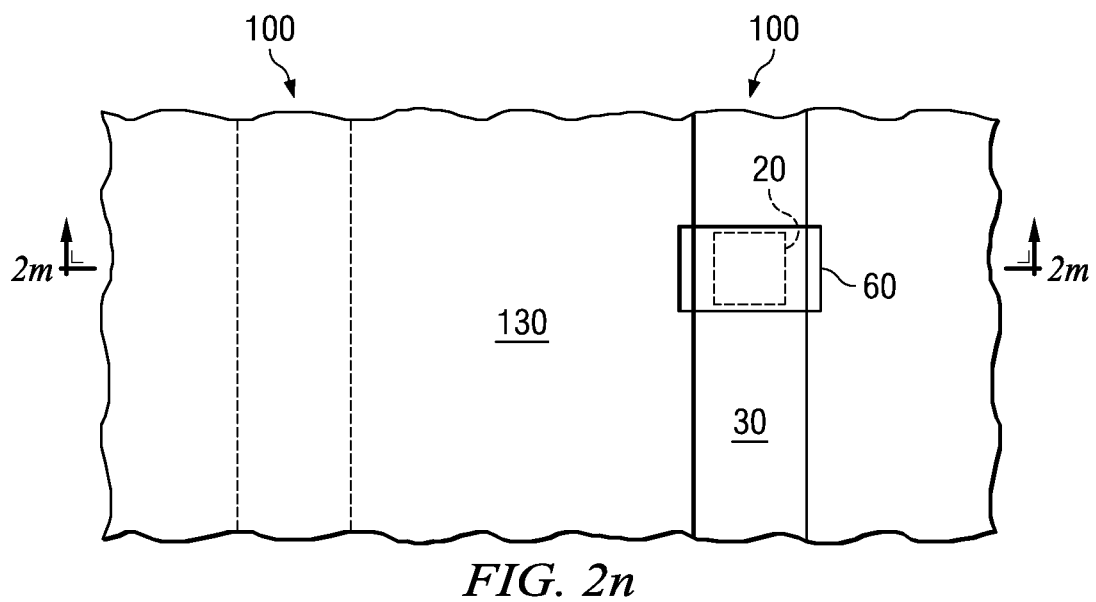

An anisotropic etch is used to etch through the second ARC layer 120, the second hard mask layer 110 and the dummy fill material 105. The anisotropic etch preferably comprises a reactive ion etch (RIE). In various embodiments, the second ARC layer 120 and the second hard mask layer 110 are etched using a $CF_4/CHF_3$ chemistry. Consequently, as illustrated in FIG. 2m, the etch proceeds by removing the dummy fill material 105 from the dummy filled trenches 100. The RIE progresses using a $CO/N_2$, $Ar/O_2$ or $O_2/CO/N_2$ chemistry to etch the dummy fill material 105 and second inter-level dielectric layer 40. The RIE chemistry may be selected differently to etch the dummy fill material 105 and the second inter-level dielectric layer 40. Other suitable etch chemistries may be used to etch the dummy fill material 105 and expose the underlying sacrificial material layer 60. The chemistry of the RIE process is selected to ensure a low etch rate of the sacrificial material layer 60. This low etch rate on the sacrificial material layer 60 protects not only the sacrificial material layer 60, but also the layers underneath it. For example, if the sacrificial material layer 60 comprises TiN, a plasma etch chemistry comprising $C_4F_8$ is selected to minimize etching of the sacrificial material layer 60. In various embodiments, the ratio of the etch rate of the sacrificial material layer 60 to the etch rate of the second inter-level dielectric layer 40 is less than about 1:5, and preferably less than about 1:10. For example, in one embodiment the etch chemistry is selected such that the ratio of the etch rate of the sacrificial material layer 60 to the etch rate of the second inter-level dielectric layer 40 is about 1:20. The top view in FIG. 2n illustrates the rim comprising the sacrificial material layer 60 formed around the trench. The anisotropic etch is stopped on the etch stop liner 30 after etching through the second inter-level dielectric layer 40. It is noted that although the via mask 140 is wider than the top width of the trench $W_M$, the via is etched only under the dummy filled trenches 100.

Figure 2O:
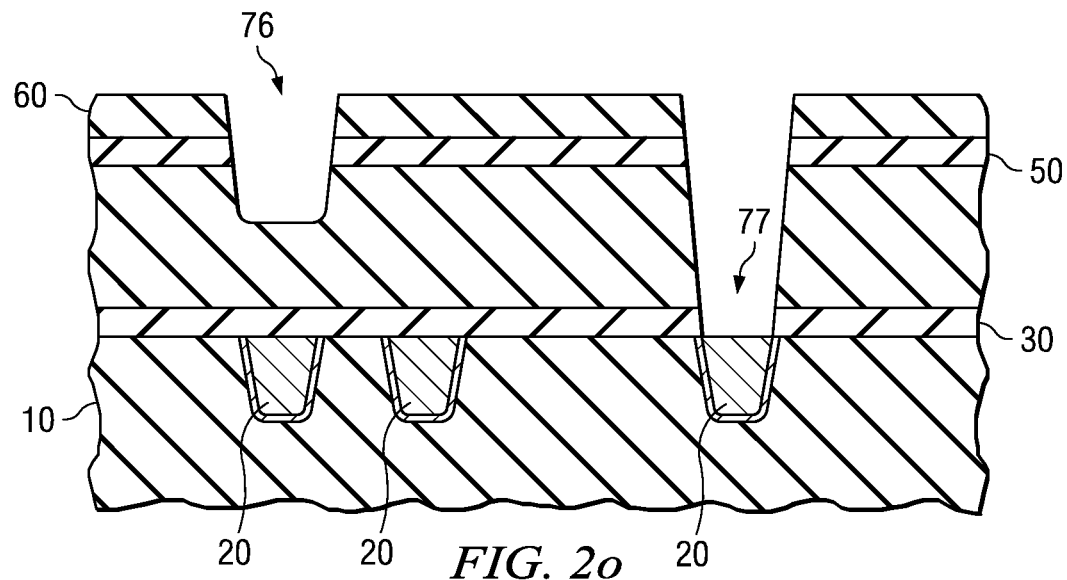
Figure 2P:
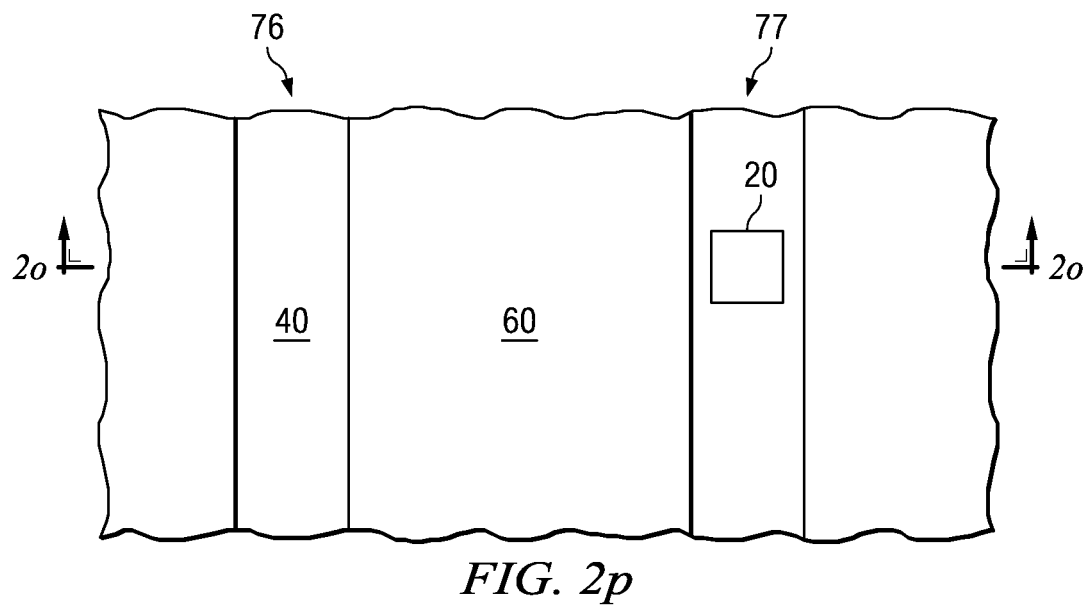

Next, as illustrated in FIGS. 2o and 2p, any remaining second photo resist 130, the second ARC layer 120, and the second hard mask layer 110 are etched and removed to expose the sacrificial material layer 60. The dummy fill material 105 is next etched and removed thus opening the metal line trench 76 and via trench 77 or via opening. The sacrificial material layer 60 protects the etching of the first hard mask layer 50 during the etching process for the removal of the dummy fill material 105. The etch stop liner 30 is next etched exposing the first metal line 20. In some embodiments, the etch stop liner 30 is etched in a $CF_4/CO$ or $Ar/CO_2/CF_4/CH_2F_2$ etch chemistry.

Figure 2Q:
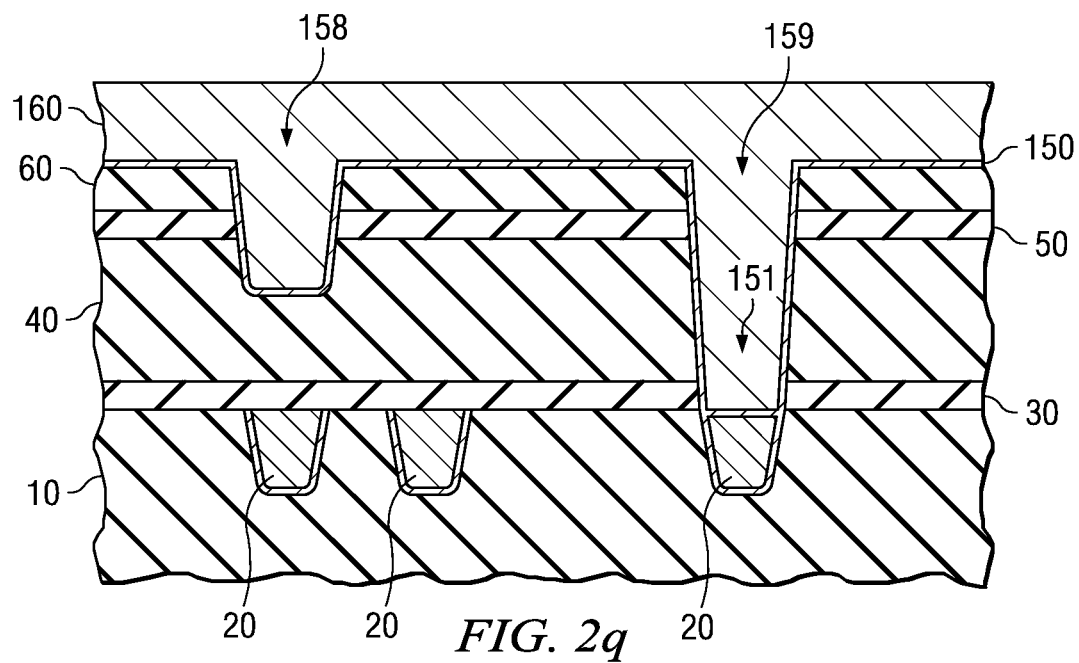
Figure 2R:
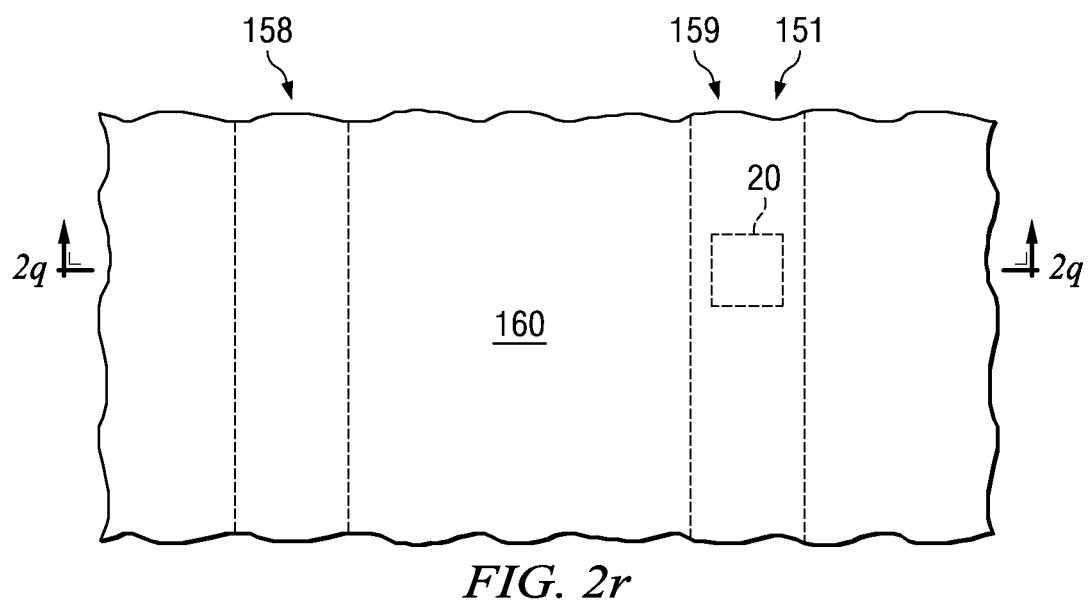
Figure 2S:
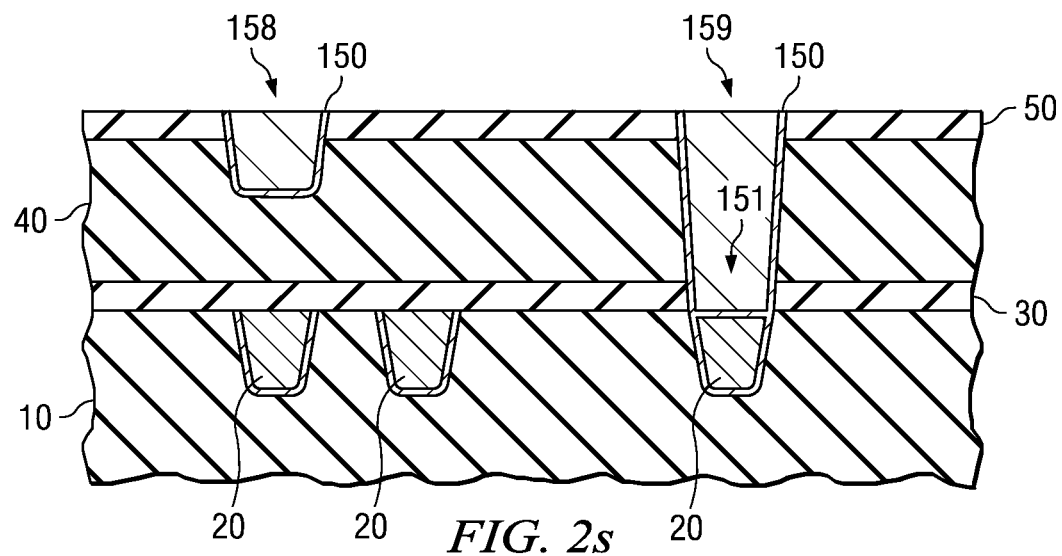
Figure 2T:
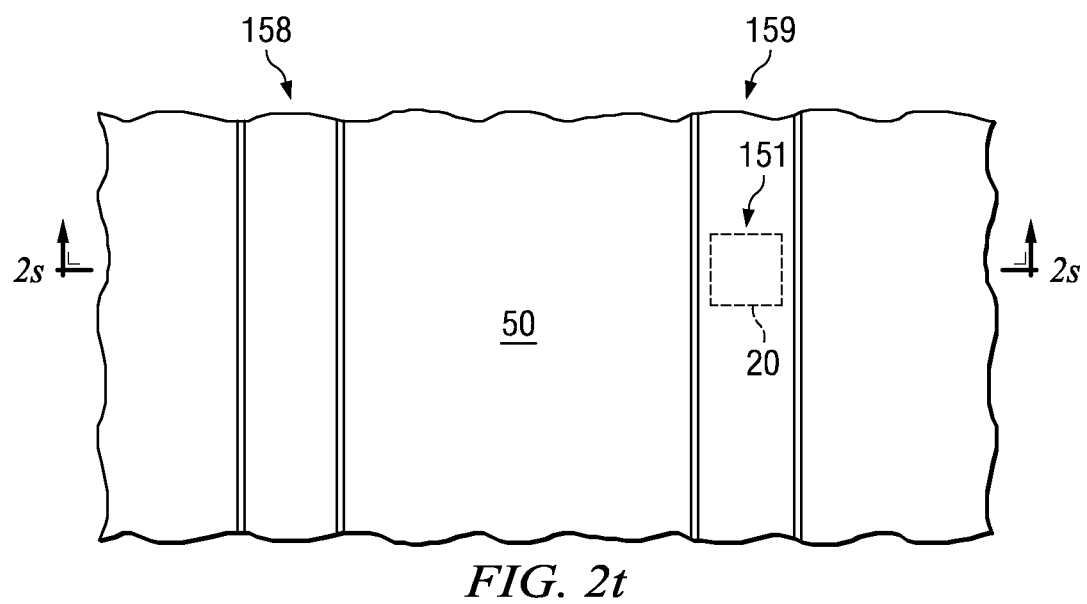
Figure 2U:
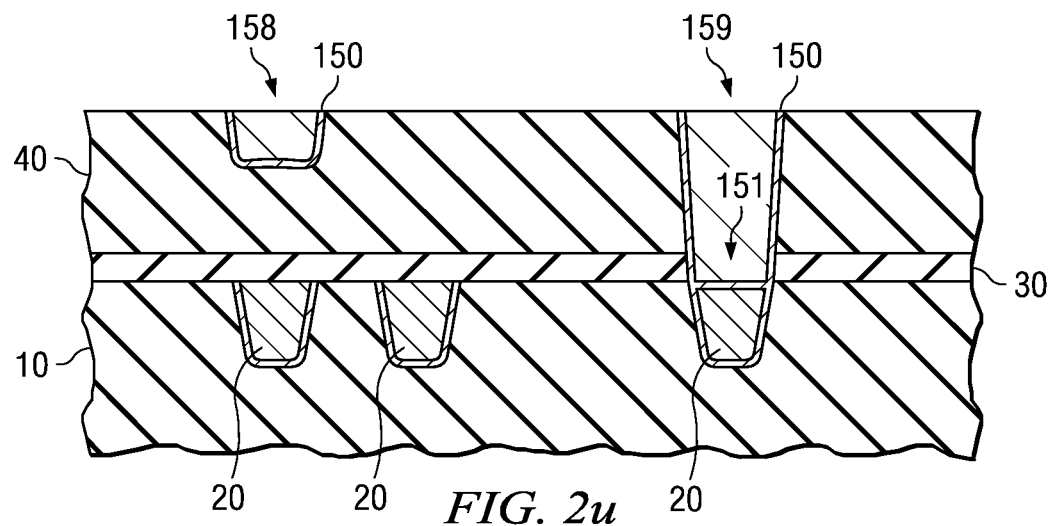
Figure 2V:
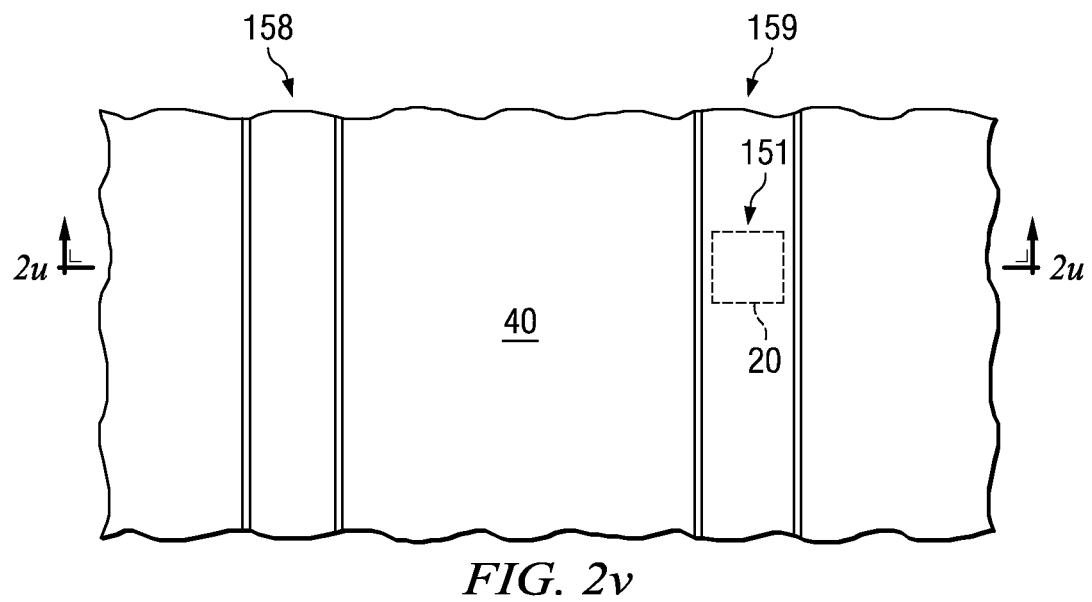

A metal liner 150 is deposited into the metal line and via trenches 76 and 77, and over a top surface of the sacrificial material layer 60, by a suitable process such as PVD, sputtering, CVD (FIG. 2q). The metal liner 150 comprises a diffusion barrier metal such as titanium nitride, titanium, tantalum, tantalum nitride, tungsten nitride, tungsten carbonitride (WCN), ruthenium or other suitable conductive nitrides or oxides. A metal 160 is deposited over the metal liner 150 (FIGS. 2q and 2r). The metal 160 is deposited by an electro chemical deposition process. The metal 160 preferably comprises copper or its alloys, although in some embodiments it may comprise aluminum, gold, tungsten, and combinations thereof or other suitable conductive materials. The metal 160 and metal liner 150 form the second and third metal lines 158 and 159, as well as via 151 connecting the first metal line 20. As illustrated in FIGS. 2s and 2t, the metal 160 is planarised and polished using a suitable process such as chemical mechanical polishing (CMP). The CMP process also removes the sacrificial material layer 60 and first hard mask layer 50. However, in various embodiments, the first hard mask layer 50 is not removed completely and used as a liner to the second inter level dielectric layer 40. FIGS. 2u and 2v also illustrate the formed second and third metal lines 158 and 159 and the via 151.

Figure 4A:
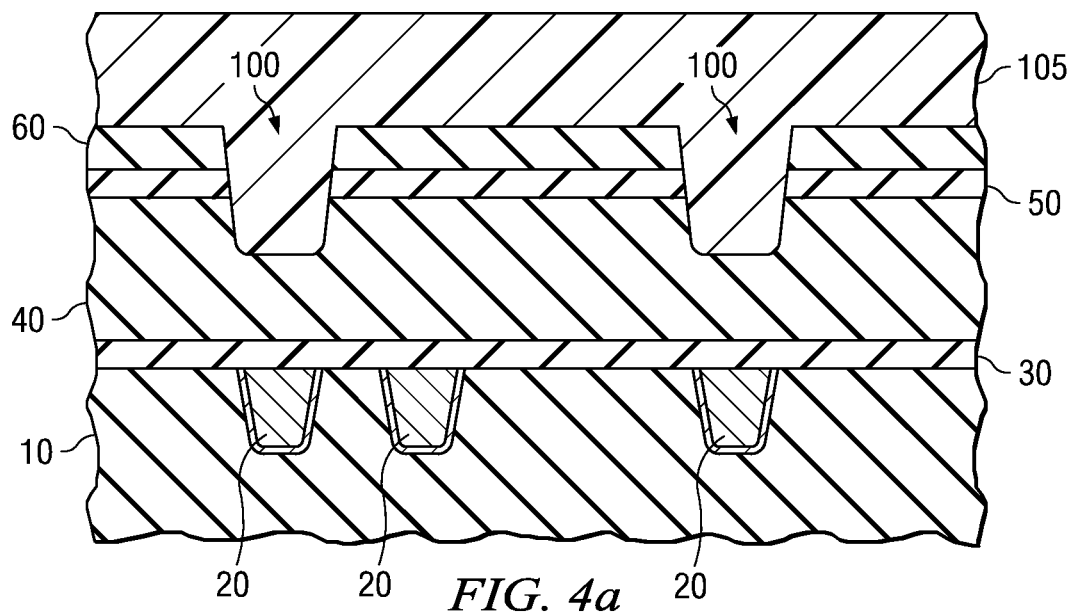
FIGS. 4a-4f, illustrates cross sectional views of a metallization layer in a method for fabrication of a metal (n+1) level and a via (n) level in various stages of processing, in accordance with embodiments of the invention.
Figure 4B:
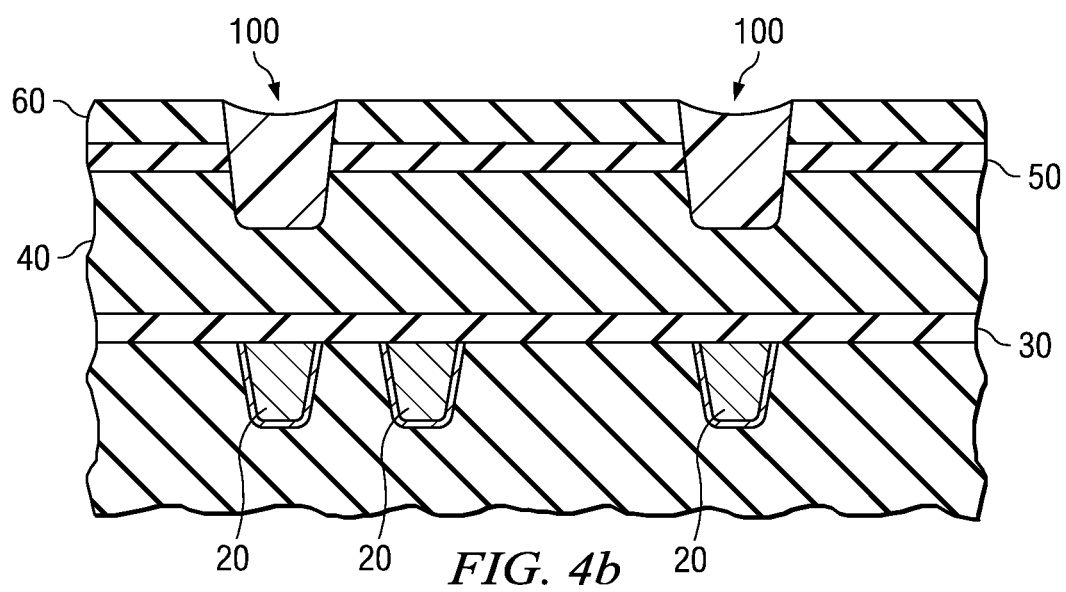
Figure 4C:
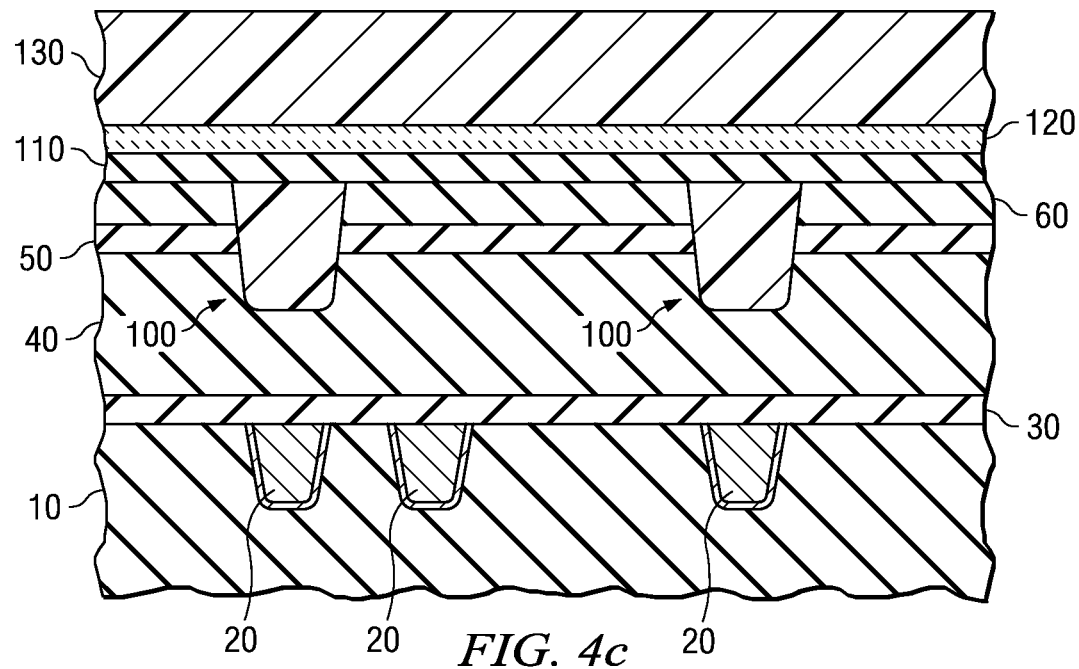
Figure 4D:
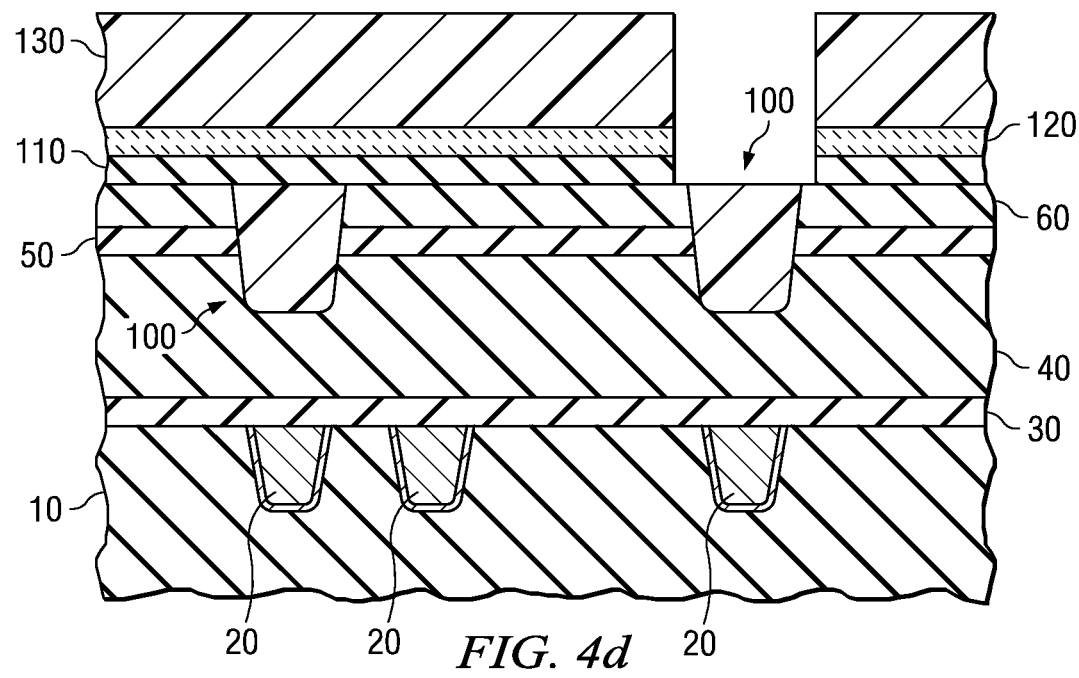
Figure 4E:
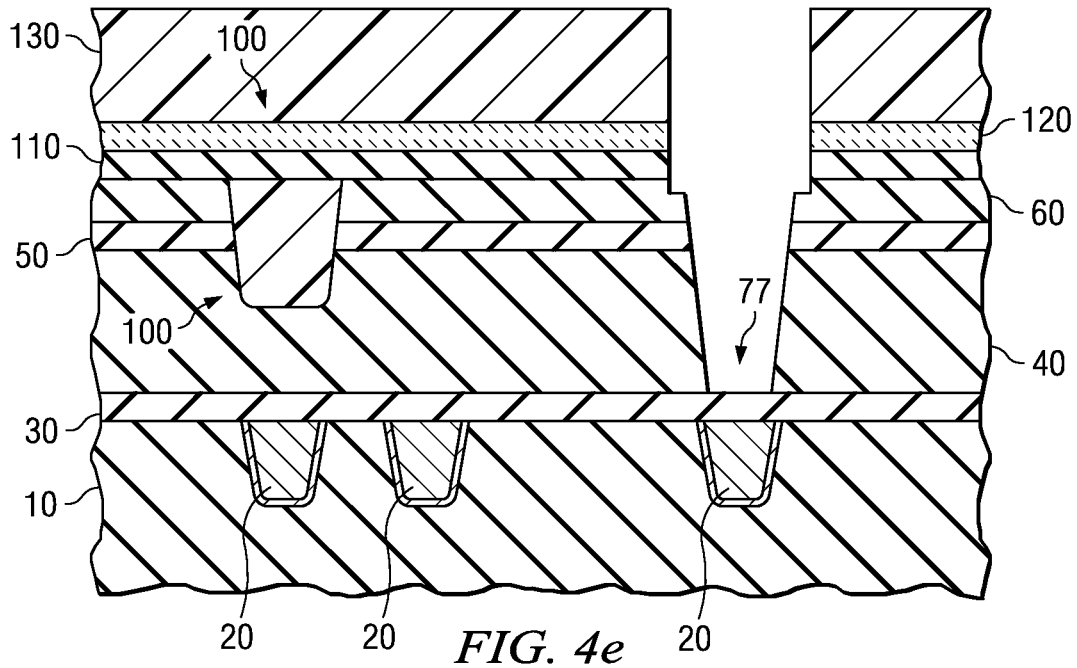
Figure 4F:
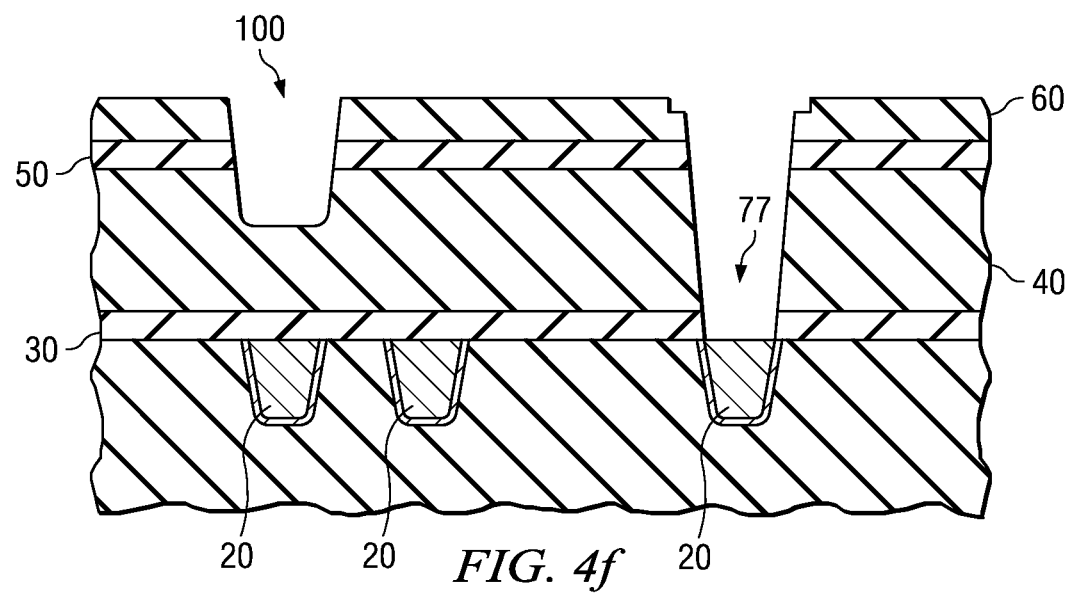
Figure 5:
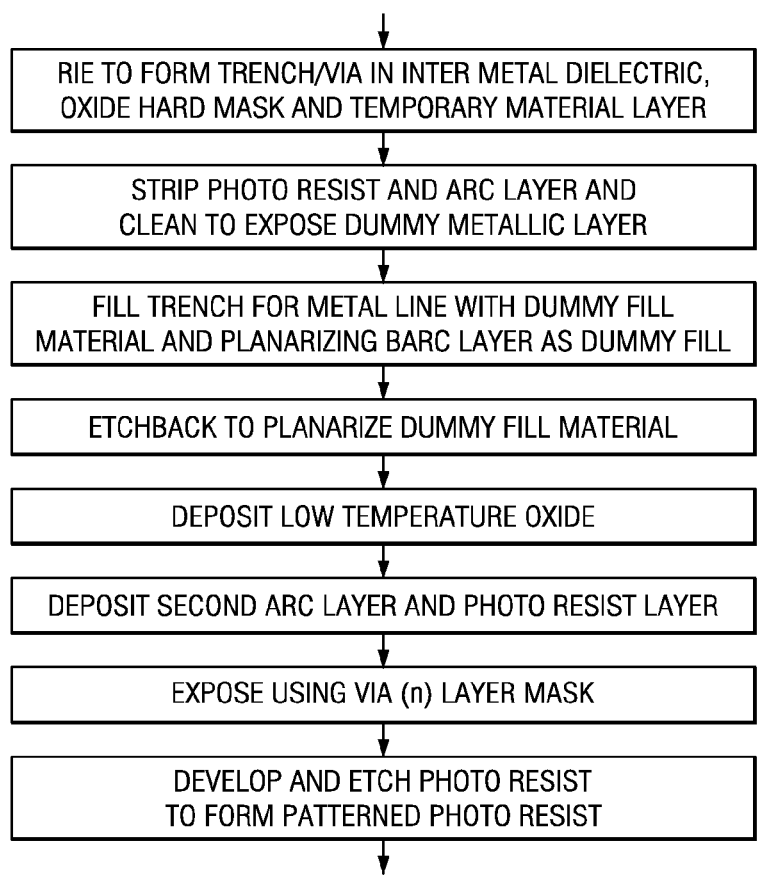
FIG. 5 illustrates a flow chart for formation of a metal and a via (n) level illustrated in FIG. 4, in accordance with embodiments of the invention.

An embodiment for fabrication of a metal level ($M_{n+1}$) and a via level ($V_n$) using a dual damascene process will be described using FIG. 4 and the flow chart of FIG. 5, in accordance to an embodiment of the invention.

The embodiment follows the description above to FIGS. 2g and 2h. As in the previous embodiment, a dummy fill material 105 fills the trenches forming the dummy filled trenches 100 (FIG. 4a). As next illustrated in FIG. 4b, the overfill of the dummy fill material 105 is etched and planarized by an RIE etch process to form a fill-plug in the etched trenches 100. Subsequent steps follow as in the prior embodiments. For example, in FIG. 4c, the first ARC layer 70 is deposited over the sacrificial material layer 60, followed by deposition of the first photo resist 80. The first photo resist 80 is patterned (FIG. 4d) followed by formation of the via trench 77.

Figure 6A:
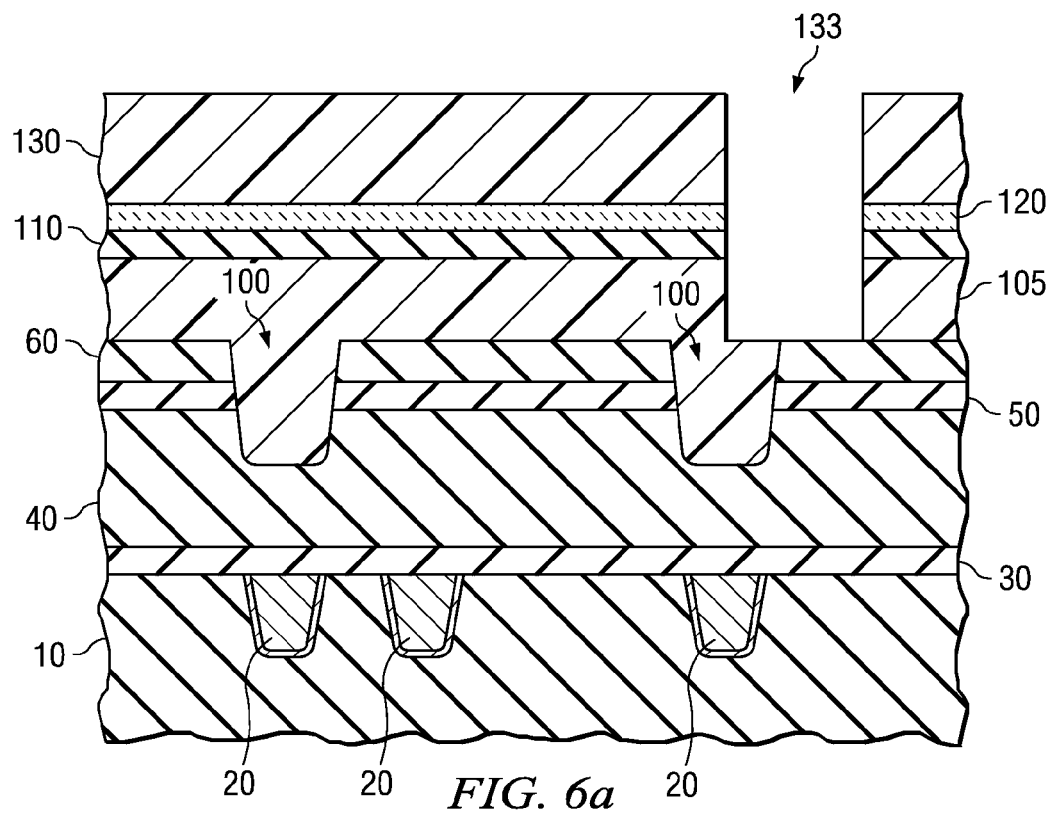
FIGS. 6a-6c, illustrates an application of the method, in accordance with an embodiment of the invention.
Figure 6B:
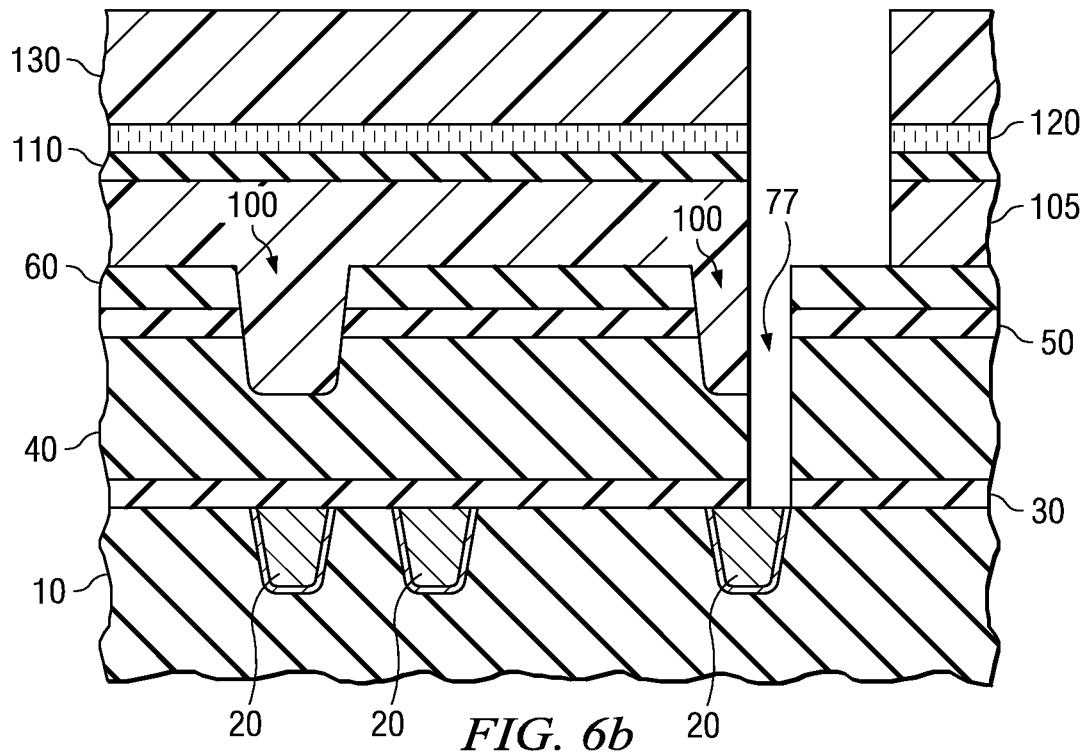
Figure 6C:
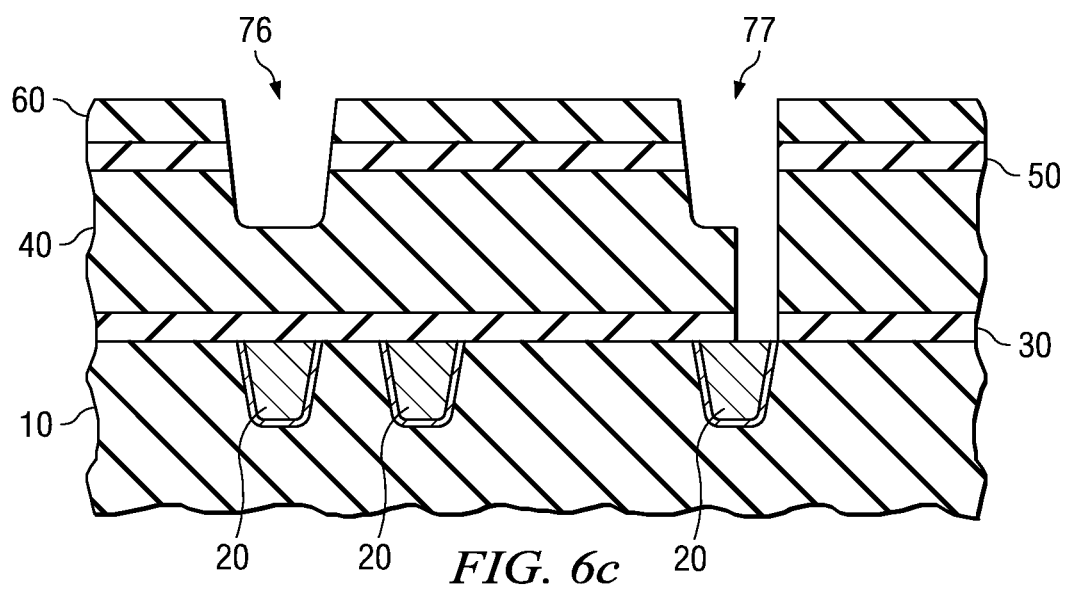

FIG. 6, which includes FIGS. 6a-6c, illustrates an application of the method to minimize misalignment between metal lines and via mask levels, in accordance with an embodiment of the invention.

Referring to FIG. 6a, the photo resist 80 is patterned as described in FIG. 2c. However, due to a misalignment between the via mask 140 and the metal line mask 90, the photo resist pattern 133 is misaligned with the dummy filled trench 100. As described in illustrating FIG. 2m, the anisotropic etch for forming the via trench 77 does not etch through the sacrificial material layer 60. Consequently, the etch proceeds by etching the regions with higher selectivity (dummy material layer 105) as illustrated in FIG. 6b. Hence, despite the misalignment between the metal line and via masks 90 and 140, the misalignment between the metal lines and vias maybe reduced (FIG. 6c).

Figure 7A:
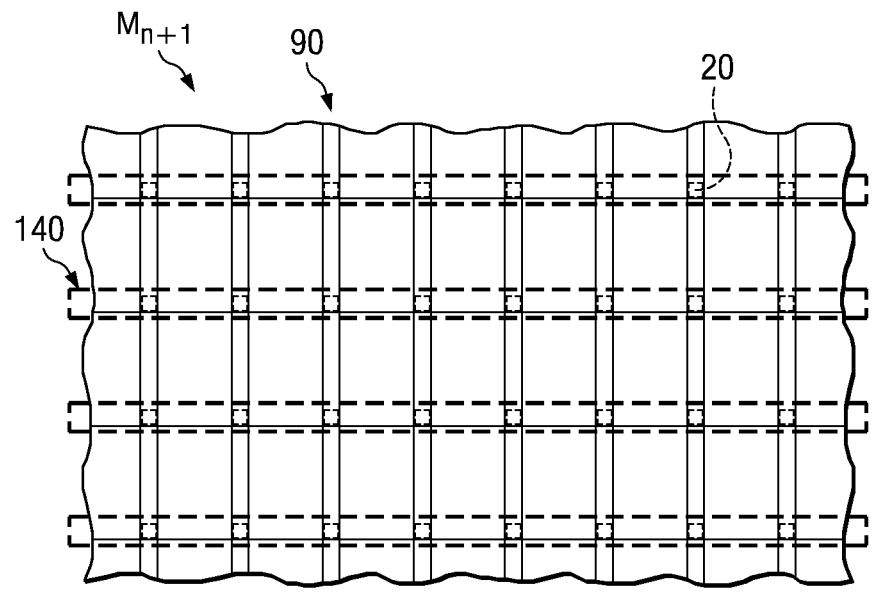
FIGS. 7a and 7b, illustrates an application of the method using via masks comprising lines, in accordance with an embodiment of the invention.
Figure 7B:
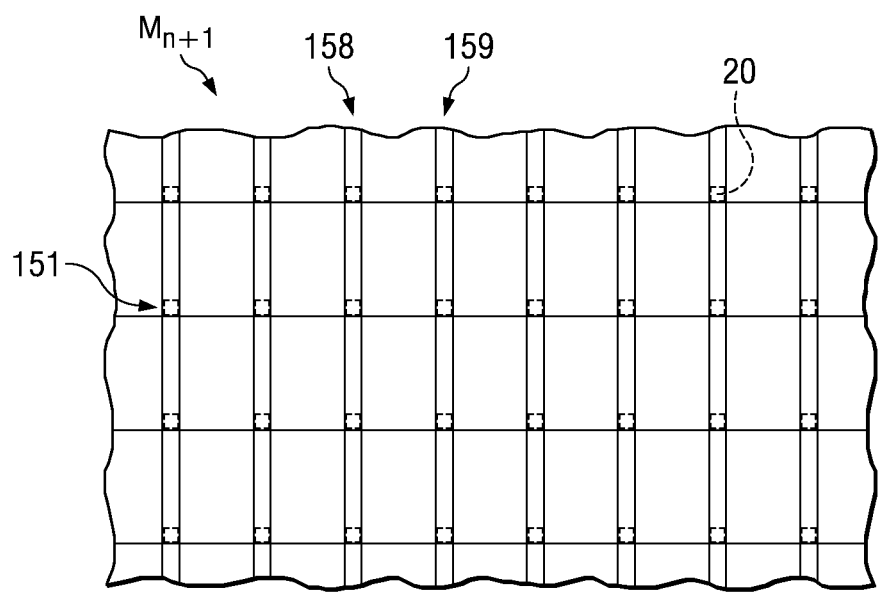

An embodiment of the invention illustrating a via mask used in the fabrication of the vias and metal lines is illustrated in FIG. 7, which includes FIGS. 7a and 7b.

The via mask design may comprise different shapes, unlike a conventional via mask. This is because, despite the larger size of the via mask, the vias are etched only in regions that overlie the metal mask. As illustrated in FIG. 7a, the metal line mask 90 and the via mask 140 are aligned perpendicularly. Further, the via mask 140 comprises a stripe, and in different embodiments, may comprise other shapes. For example, the via mask may comprise a line, a square, a circle, or any other suitable shape. In various embodiments of the invention, the vias are patterned only in the regions common to both the metal line mask 90 and the via mask 140. Hence, as next illustrated in FIG. 7b, the vias (e.g., via 151) are formed only over the first metal line 20 and connect the first metal line 20 to the metal lines in the $M_{n+1}$ metal level.

Figure 8A:
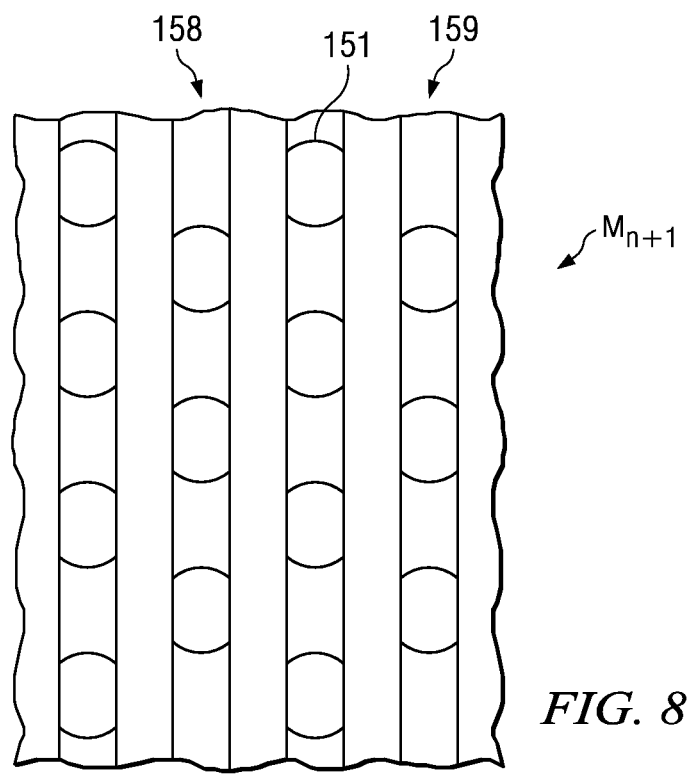
Figure 8B:
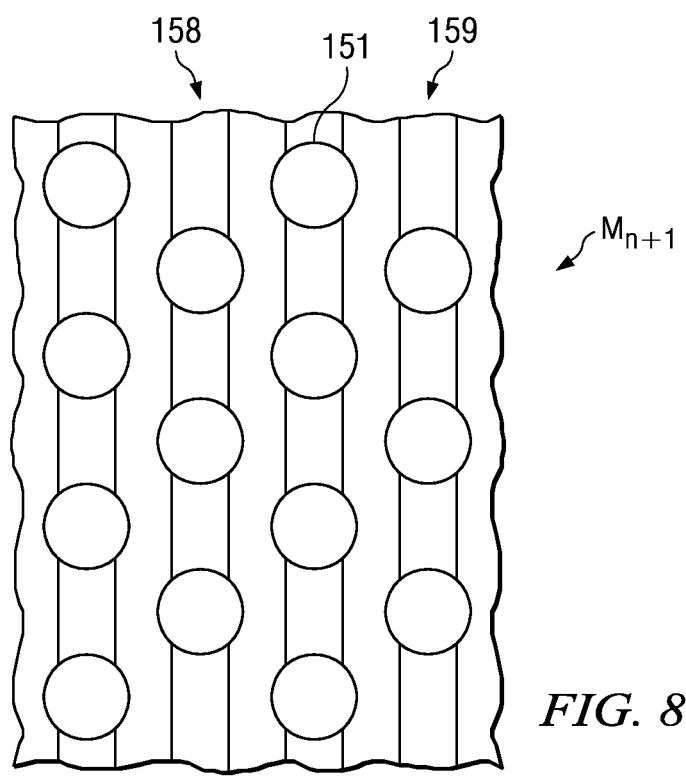
FIG. 8b illustrates a metal level fabricated with conventional processes.

FIG. 8 illustrates a top view of a metal level, wherein FIG. 8a illustrates the top view of a metal level fabricated using embodiments of the invention, and FIG. 8b illustrates a metal level fabricated with conventional processes.

Referring to FIG. 8a, the metal lines (for example, second and third metal lines 158 and 159) comprise a top critical dimension (width) that is constant across the metal level. Metal lines in regions overlying vias 151 are printed and formed at the same width. Also the top surface of the vias 151 and the bottom surface of the metal line comprise the same width. Hence, in various embodiments of the invention, vias have a circular or arc shape on two sides but a linear shape on the other two. However, in metal levels formed with conventional processes the top surface of the via is wider than the bottom surface of the metal line where the metal line is above the vias (FIG. 8b). Also, vias formed using conventional processing comprise a circular or oval shape.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising multiple levels of metallization, at least one metallization level comprising:
    a first metal level overlying a via level, the first metal level comprising metal lines embedded in an insulating layer; and
    vias disposed in the via level, and disposed underneath the first metal level, wherein a top view of the first via comprises four sides, wherein two of the four sides along a width comprise an arc shape and the remaining two of the four sides along a length are linear.

2. The semiconductor device of claim 1, wherein the metal lines comprise a first metal line, wherein the vias comprise a first via, and wherein the first metal line and the first via are formed as a single structure without a diffusion layer separating the first via from the first metal line.

3. The semiconductor device of claim 1, wherein the vias and the metal lines comprise copper.

4. The semiconductor device of claim 1, wherein the metal lines comprise a first metal line having first sidewalls, wherein the vias comprise a first via having second sidewalls, and wherein a metal liner continuously covers the first sidewalls and the second sidewalls.

5. The semiconductor device of claim 4, wherein the metal liner comprises a diffusion barrier metal.

6. The semiconductor device of claim 4, wherein the metal liner comprises a material selected from the group consisting of titanium nitride, titanium, tantalum, tantalum nitride, tungsten nitride, tungsten carbo nitride (WCN), and ruthenium.

7. The semiconductor device of claim 4, wherein a conductive material is disposed within the metal liner thereby forming the first via and the first metal line.

8. The semiconductor device of claim 1, wherein the length is longer than the width, wherein the length and width are measured along a surface parallel to a top surface of the insulating layer.

9. An interconnect structure comprising:
a first metal line disposed in a first insulating layer;
a second insulating layer disposed on the first insulating layer;
a first via disposed in the second insulating layer, the first via disposed on the first metal line, wherein a top view of the first via comprises four sides, wherein one of the four sides comprise an arc shape and one of the four sides is linear; and
a second metal line disposed in the second insulating layer, wherein at least a portion of the second metal line is disposed on the first via, and wherein a bottom critical dimension (CD) of the second metal line in a region overlying the first via is equal to a top CD of the first via.

10. The interconnect structure of claim 9, wherein the second metal line and the first via are formed as a single structure without a diffusion layer separating the first via from the second metal line.

11. The interconnect structure of claim 9, wherein the second metal line has first sidewalls, wherein the first via has second sidewalls, and wherein a metal liner continuously covers the first sidewalls and the second sidewalls.

12. The interconnect structure of claim 11, wherein the metal liner comprises a diffusion barrier metal.

13. The interconnect structure of claim 11, wherein the metal liner comprises a material selected from the group consisting of titanium nitride, titanium, tantalum, tantalum nitride, tungsten nitride, tungsten carbo nitride (WCN), and ruthenium.

14. The interconnect structure of claim 11, wherein a conductive material is disposed within the metal liner thereby forming the first via and the second metal line.

15. The interconnect structure of claim 14, wherein the conductive material comprises copper.

16. The interconnect structure of claim 14, wherein the conductive material comprises a material selected from the group consisting of gold and tungsten.

17. The interconnect structure of claim 9, wherein two of the four sides are linear, and wherein the bottom critical dimension (CD) is measured at the bottom of the second metal line and measures a distance between the two linear sides.

18. The interconnect structure of claim 17, further comprising:
a third metal line disposed in the first insulating layer; and
a second via disposed in the second insulating layer, the second via disposed on the third metal line; and
a fourth metal line disposed in the second insulating layer.

19. The interconnect structure of claim 18, wherein at least a portion of the fourth metal line is disposed on the second via, and wherein a bottom critical dimension (CD) of the fourth metal line in a region overlying the second via is about the same as a top CD of the second via, wherein the bottom CD is measured at the bottom of the fourth metal line and measures a distance between the two linear sides.

20. The interconnect structure of claim 18, wherein a top view of the second via comprises four sides, wherein two of the four sides of the second via comprise an arc shape and the remaining two of the four sides are linear.

21. An interconnect structure comprising:
a first metal line disposed in a first insulating layer;
a second insulating layer disposed on the first insulating layer;
a first via disposed in the second insulating layer, the first via disposed on the first metal line; and
a second metal line disposed in the second insulating layer, wherein at least a portion of the second metal line is disposed on the first via, and wherein a top view of the first via comprises four sides, wherein two of the four sides comprise an arc shape along a width of the second metal line and the remaining two of the four sides along a length of the second metal line are linear, the length being longer than the width, wherein the length and width are measured along a surface parallel to a top surface of the first insulating layer.

22. The interconnect structure of claim 21, wherein the second metal line and the first via are formed as a single structure without a diffusion layer separating the first via from the second metal line.

23. The interconnect structure of claim 21, further comprising:
a third metal line disposed in the first insulating layer; and
a second via disposed in the second insulating layer, the second via disposed on the third metal line; and
a fourth metal line disposed in the second insulating layer, wherein a top view of the second via comprises four sides, wherein two of the four sides of the second via along a width of the second via comprise an arc shape and the remaining two of the four sides of the second via along a length of the fourth metal line are linear.

24. The interconnect structure of claim 23, wherein the second metal line has first sidewalls, wherein the first via has second sidewalls, and wherein a first metal liner continuously covers the first sidewalls and the second sidewalls.

25. The interconnect structure of claim 24, wherein the fourth metal line has third sidewalls, wherein the second via has fourth sidewalls, and wherein a second metal liner continuously covers the third sidewalls and the fourth sidewalls.

26. The semiconductor device of claim 1, wherein a top width of the metal lines in a region overlying the vias is about the same as a top width of the metal lines in a region not overlying the vias.

27. An interconnect structure comprising:
a first metal line disposed in a first insulating layer;
a second insulating layer disposed on the first insulating layer;
a first via disposed in the second insulating layer, the first via disposed on the first metal line; and
a second metal line disposed in the second insulating layer, wherein at least a portion of the second metal line is disposed on the first via, and wherein a bottom critical dimension (CD) of the second metal line in a region overlying the first via is about the same as a top CD of the first via, wherein, in a top view, the first via comprises a first side, a second side, a third side, and a fourth side, wherein the first side is oriented along a width of the second metal line, wherein the second side and the third side are oriented along a length of the second metal line, wherein the first side comprises an arc shape and the second side and the third side comprise a linear shape, wherein the bottom critical dimension (CD) is measured at the bottom of the second metal line and measures a distance between the second side and the third side.

28. The interconnect structure of claim 27, further comprising:
a third metal line disposed in the first insulating layer; and
a second via disposed in the second insulating layer, the second via disposed on the third metal line; and
a fourth metal line disposed in the second insulating layer.

29. The interconnect structure of claim 28, wherein at least a portion of the fourth metal line is disposed on the second via, and wherein a bottom critical dimension (CD) of the fourth metal line in a region overlying the second via is about the same as a top CD of the second via, wherein the bottom CD is measured at the bottom of the fourth metal line and measures a distance between the two linear sides.

30. The interconnect structure of claim 28, wherein the fourth side is oriented along the width of the second metal line, wherein the fourth side comprises an arc shape.

* * * * *